(12) United States Patent
Zhang et al.

(10) Patent No.: US 11,800,790 B2
(45) Date of Patent: Oct. 24, 2023

(54) MONOCARBORANE CLUSTER-CONTAINING PLATINUM COMPLEXES AND PREPARATION METHOD AND OLED APPLICATION

(71) Applicant: GUANGXI MINZU UNIVERSITY, Nanning (CN)

(72) Inventors: Yuzhen Zhang, Nanning (CN); Yunjun Shen, Nanning (CN); Chuanli Nie, Nanning (CN); Hedong Bian, Nanning (CN); Xiangjun Kong, Nanning (CN)

(73) Assignee: Guangxi Minzu University, Nanning (CN)

( * ) Notice: Subject to any disclaimer, the term of this patent is extended or adjusted under 35 U.S.C. 154(b) by 0 days.

(21) Appl. No.: 17/933,213

(22) Filed: Sep. 19, 2022

(65) Prior Publication Data

US 2023/0095100 A1 Mar. 30, 2023

(30) Foreign Application Priority Data

Sep. 18, 2021 (CN) .......................... 202111096756.7

(51) Int. Cl.
*C07F 15/00* (2006.01)
*H01L 51/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .. C07F 15/0086; H10K 50/10; H10K 85/346; C09K 11/00
(Continued)

(56) References Cited

PUBLICATIONS

Jenkins, D.M. et al.: Cyclometalated Platinum (II) diimine complexes: Synthetically tuning the photophysical and electrochemical properties. Dalton Transactions, vol. 41, pp. 8077-8085, 2012.*

* cited by examiner

*Primary Examiner* — Charanjit Aulakh
(74) *Attorney, Agent, or Firm* — Workman Nydegger

(57) ABSTRACT

The present disclosure provides four monocarborane cluster-containing platinum complexes and a preparation method and an OLED application. The monocarborane cluster-containing platinum complex has a general structural formula selected from the group consisting of the following general structural formulas:

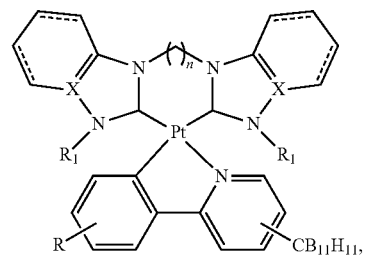

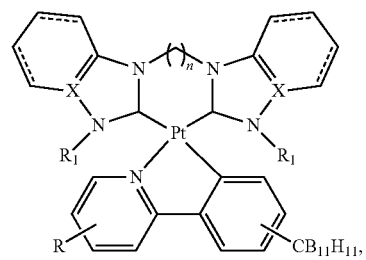

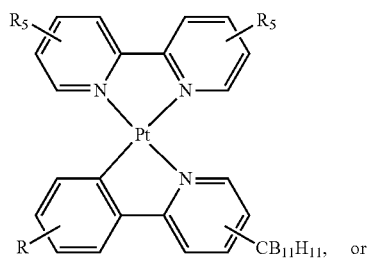

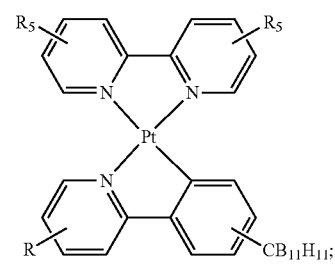

wherein $-R_1$ is selected from the group consisting of $C_{4-12}$ linear alkyl; each R and $R_5$ are independently any one selected from the group consisting of $-CH_3$, H, tert-butyl (Continued)

and aryl; aryl is any one selected from the group consisting of phenyl, carbazole

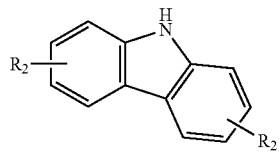

and aniline

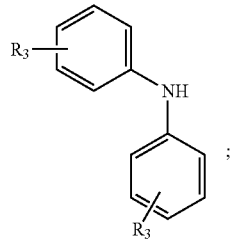

wherein $R_2$ is any one selected from the group consisting of methyl, tert-butyl and phenyl; $R_3$ is any one selected from the group consisting of methyl, tert-butyl and phenyl; n is 1 to 3; X is C element; when the ligand of the general structural formula is triazole, X is N element; —$CB_{11}H_{11}$ is monocarborane with a structure of

12 Claims, 20 Drawing Sheets

(51) Int. Cl.
*H10K 85/30* (2023.01)
*C09K 11/06* (2006.01)
*H10K 101/10* (2023.01)
*H10K 50/11* (2023.01)

(52) U.S. Cl.
CPC .............. *C09K 2211/1029* (2013.01); *C09K 2211/1044* (2013.01); *C09K 2211/1096* (2013.01); *C09K 2211/185* (2013.01); *H10K 50/11* (2023.02); *H10K 2101/10* (2023.02)

(58) Field of Classification Search
USPC .......................... 546/2, 13; 313/504
See application file for complete search history.

MONOCARBORANE CLUSTER-CONTAINING PLATINUM COMPLEXES AND PREPARATION METHOD AND OLED APPLICATION

CROSS REFERENCE TO RELATED APPLICATION

This patent application claims the benefit and priority of Chinese Patent Application No. 202111096756.7, entitled "Monocarborane cluster-containing platinum complexes and preparation method and use thereof" filed on Sep. 18, 2021, the disclosure of which is incorporated by reference herein in its entirety as part of the present application.

TECHNICAL FIELD

The present disclosure belongs to the technical field of optoelectronic materials, and in particular relates to monocarborane cluster-containing platinum complexes and a preparation method and an OLED application.

BACKGROUND ART

Organic light-emitting diodes (OLEDs) have a great potential for realizing novel optoelectronic devices (such as flat-panel displays and lighting applications) due to the properties of these organic semiconductor materials, including flexibility over large areas, low-cost fabrication, and high-performance optical and electrical properties. In order to improve the electroluminescence efficiency of the OLEDs, various fluorescence and phosphorescence-based emissive materials have been developed. Although organic electroluminescent devices using fluorescent materials have achieved high reliability, the internal electroluminescence quantum efficiency (defined as the number of photons generated per injected carrier) of these organic electroluminescent devices is limited to 25% due to the exciton branching ratio of the singlet excited state under electrical excitation. In contrast, the internal electroluminescence quantum efficiency of the OLEDs using phosphorescent materials reaches almost 100%.

OLEDs have rapidly developed into one of the leading technologies for full-color displays and environmental-friendly light sources due to their outstanding features, such as excellent color quality, wide viewing angles, mercury-free manufacturing and attractive flexibility. Various materials, device structures, and processing techniques have been investigated to optimize device performances to meet the requirements of lighting and display applications. However, the OLEDs need to be improved due to their shortcomings such as their short lifespan.

SUMMARY

In view of the above problems, the present disclosure provides a monocarborane cluster-containing platinum complex. The complex solves the problems such as low luminous efficiency and short service life in the prior art due to the shortage of existing phosphorescent materials.

The present disclosure is achieved by the following technical solutions. The present disclosure provides a monocarborane cluster-containing platinum complex, which has a general structural formula selected from the group consisting of the following general structural formulas:

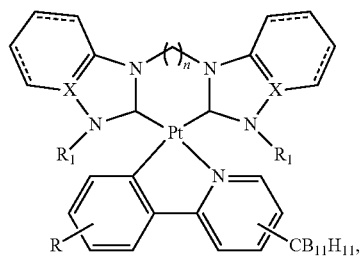

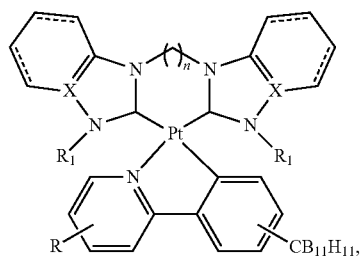

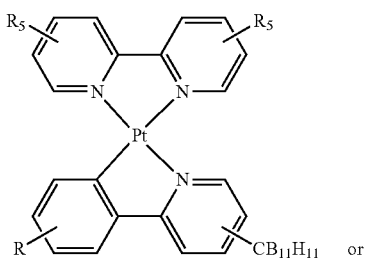

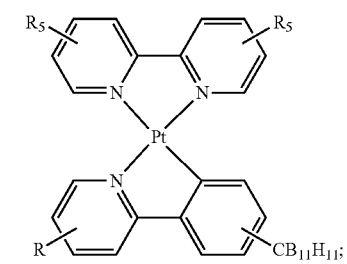

where $-R_1$ is selected from the group consisting of $C_{4-12}$ linear alkyl; each R and $R_5$ are independently any one selected from the group consisting of $-CH_3$, H, tert-butyl and aryl; n is 1 to 3; X is an element of C or N; when the ligand of the general structural formula is benzimidazole or imidazole, X is C element; when the ligand of the general structural formula is triazole, X is N element; $-CB_{11}H_{11}$ is monocarborane with a structure of

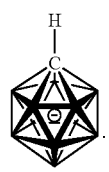

In some embodiments, aryl is any one selected from the group consisting of phenyl, carbazole

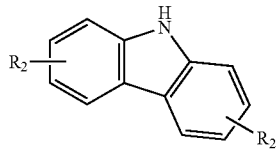

and aniline

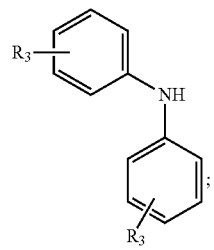

where $R_2$ is any one selected from the group consisting of methyl, tert-butyl and phenyl; $R_3$ is any one selected from the group consisting of methyl, tert-butyl and phenyl.

The present disclosure further provides a method for preparing the monocarborane cluster-containing platinum complex, comprising:

step 1, adding a organometallic compound I or a complex VII to a first solvent, and heating to 60° C., and then conducting a reaction with silver trifluoromethanesulfonate in the dark for 1 h; the compound I and the complex VII have the following structural formulas:

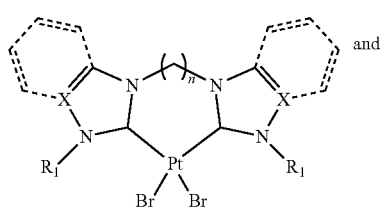

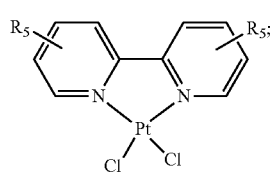

step 2, adding a compound III or a compound IV and an alkali to the reaction product obtained from step 1, and conducting a reaction under $N_2$ protection to obtain a reaction mixture; the reaction is conducted at 60° C.; the reaction is conducted for 12 h; the compound III and the compound IV have the following structural formulas:

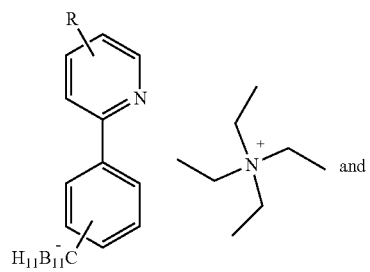

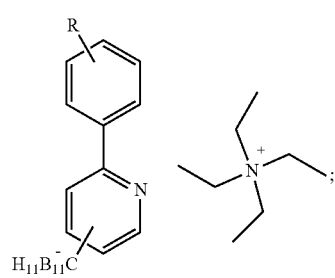

and step 3, cooling the reaction mixture to room temperature, filtering, rotary evaporating to remove the first solvent and purifying through column chromatography isolation to obtain the monocarborane cluster-containing platinum complex.

In some embodiments, the first solvent is a mixture of dichloromethane and tetrahydrofuran at a ratio of 3:1.

In some embodiments, a molar ratio of the compound I or the complex VII to the compound III or the compound IV is in a range of 1:(1.1-1.2); a ratio of the compound I to the first solvent is in a range of 1 mmol:(80-150) mL.

In some embodiments, the alkali is potassium tert-butoxide.

In some embodiments, the compound I and the complex VII are performed by the following steps:

step 10, adding a compound II and a platinum compound into a second solvent, and heating for a reaction under $N_2$ protection for 10 h to obtain a mixture I; the platinum compound is platinum acetylacetonate; the second solvent is dimethyl sulfoxide; the reaction is performed at 110° C.;

step 11, subjecting the mixture I to a reduced pressure distillation, extracting with dichloromethane, washing with water to obtain an organic phase, collecting the organic phase, drying with anhydrous magnesium sulfate, evaporating the second solvent, purifying through column chromatography isolation and drying to obtain the compound I;

step 12, adding a compound VIII and a platinum compound into a second solvent, and heating for a reaction under $N_2$ protection for 10 h to obtain a mixture II; the platinum compound is potassium tetrachloroplatinate; the second solvent is a mixture of hydrochloric acid and chloroform at a ratio of 4:1; the reaction is performed at 60° C.; and step 13, filtering the mixture II to obtain a filtrate, and washing the filtrate with water, n-hexane and methanol in sequence to obtain the compound VII;

the compound II and the compound VIII have the following structural formulas:

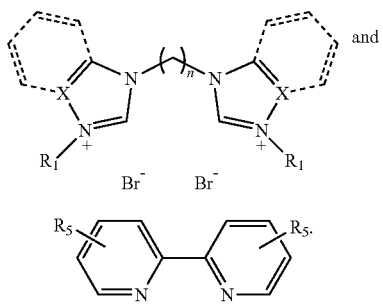

(II)

(VIII)

In some embodiments, a molar ratio of the compound II or the compound VIII to the platinum compound is in a range of 1:(1.1-1.2).

In some embodiments, the compound III and the compound IV are performed by the following steps:

step 20, putting carborane into a third solvent and adding n-butyl lithium, and then adding cuprous iodide after 1.5 h, and conducting a reaction for 40 min;

step 21, adding a palladium catalyst, a phosphorus ligand, and a compound V or a compound VI into the reaction product obtained from step 20, and conducting a reaction at room temperature for 20-24 h under $N_2$ protection; and step 22, cooling the reaction product obtained from step 21 to room temperature, conducting a suction filtration with diatomaceous earth to obtain a filtrate, extracting the filtrate with ether after rotary evaporation, washing with hydrochloric acid to obtain an organic phase, spin-drying the organic phase, and purifying by cation exchange and column chromatography isolation to obtain the compound III and the compound IV; the compound V and the compound VI have the following structural formulas:

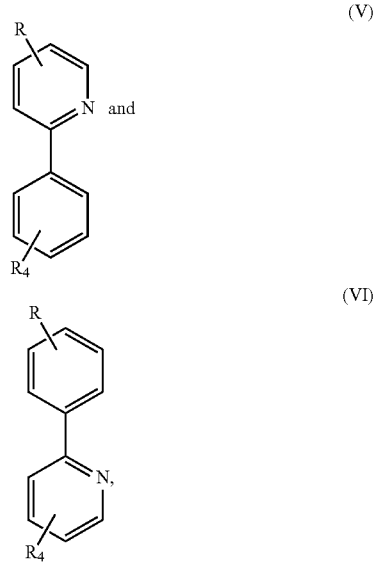

(V)

(VI)

where $R_4$ is a halogen group; the third solvent is tetrahydrofuran; the palladium catalyst is palladium acetate; the phosphorus ligand is tris(2-methoxyphenyl)phosphine; a molar ratio of borane to the compound V or the compound VI is 1:1.1; a molar ratio of carborane to the compound V or the compound VI is 1:1.1.

The present disclosure further provides use of the monocarborane cluster-containing platinum complex in an OLED, where the monocarborane cluster-containing platinum complex is applied to an emission layer of the OLED.

The present disclosure provides monocarborane cluster-containing platinum complexes and a preparation method and an OLED application, and has the following beneficial effects:

(1) In the present disclosure, the platinum complex has high luminous efficiency and high electron mobility.

(2) In the present disclosure, the platinum complex can be used as a luminescent center in the emission layer of the OLEDs.

BRIEF DESCRIPTION OF THE DRAWINGS

FIGS. 7A-7D show an electroluminescent (EL) characteristic diagram of the monocarborane cluster-containing platinum complexes of the present disclosure applied to OLEDs, in which FIG. 7A represents the normalized EL of the monocarborane cluster-containing platinum complexes as a function of wavelength; FIG. 7B represents the luminance of the monocarborane cluster-containing platinum complexes as a function of voltage; FIG. 7C represents the current density of the monocarborane cluster-containing platinum complexes as a function of voltage; FIG. 7D represents the EQE of the monocarborane cluster-containing platinum complexes as a function of luminance.

FIGS. 15A-15D show EL characteristics of the monocarborane cluster-containing platinum complex $C_3$ of the present disclosure applied to OLEDs, in which FIG. 15A represents the normalized EL of the monocarborane cluster-containing platinum complex $C_3$ as a function of wavelength; FIG. 15B represents the current density of the monocarborane cluster-containing platinum complex $C_3$ as a function of voltage; FIG. 15C represents the luminance of the monocarborane cluster-containing platinum complex $C_3$ as a function of voltage; FIG. 15D represents the EQE of the monocarborane cluster-containing platinum complex $C_3$ as a function of luminance.

DETAILED DESCRIPTION OF THE EMBODIMENTS

Figure 1:
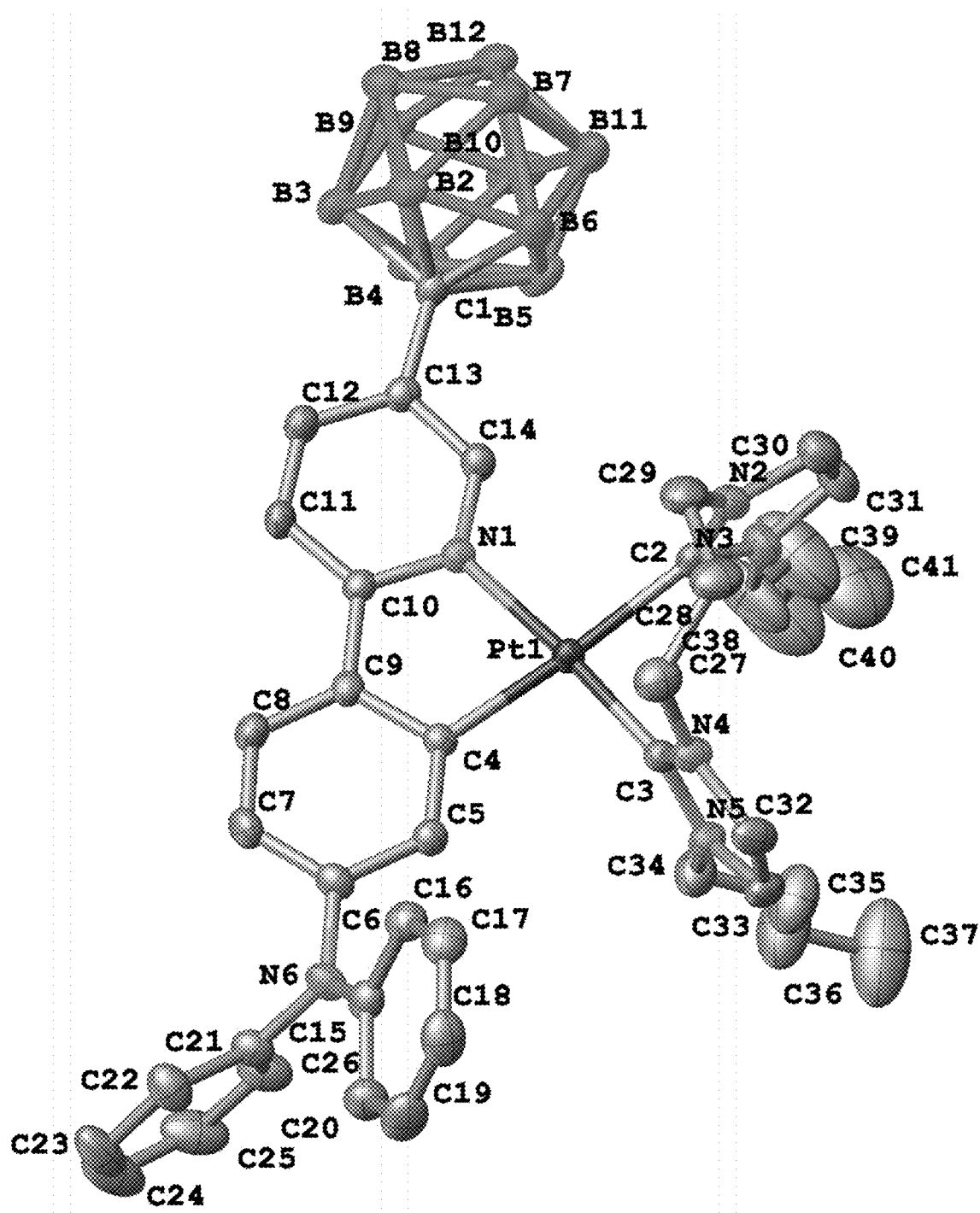
FIG. 1 shows a structural diagram of the structural characterization data of the platinum complex $C_3$ of the present disclosure.
Figure 2:
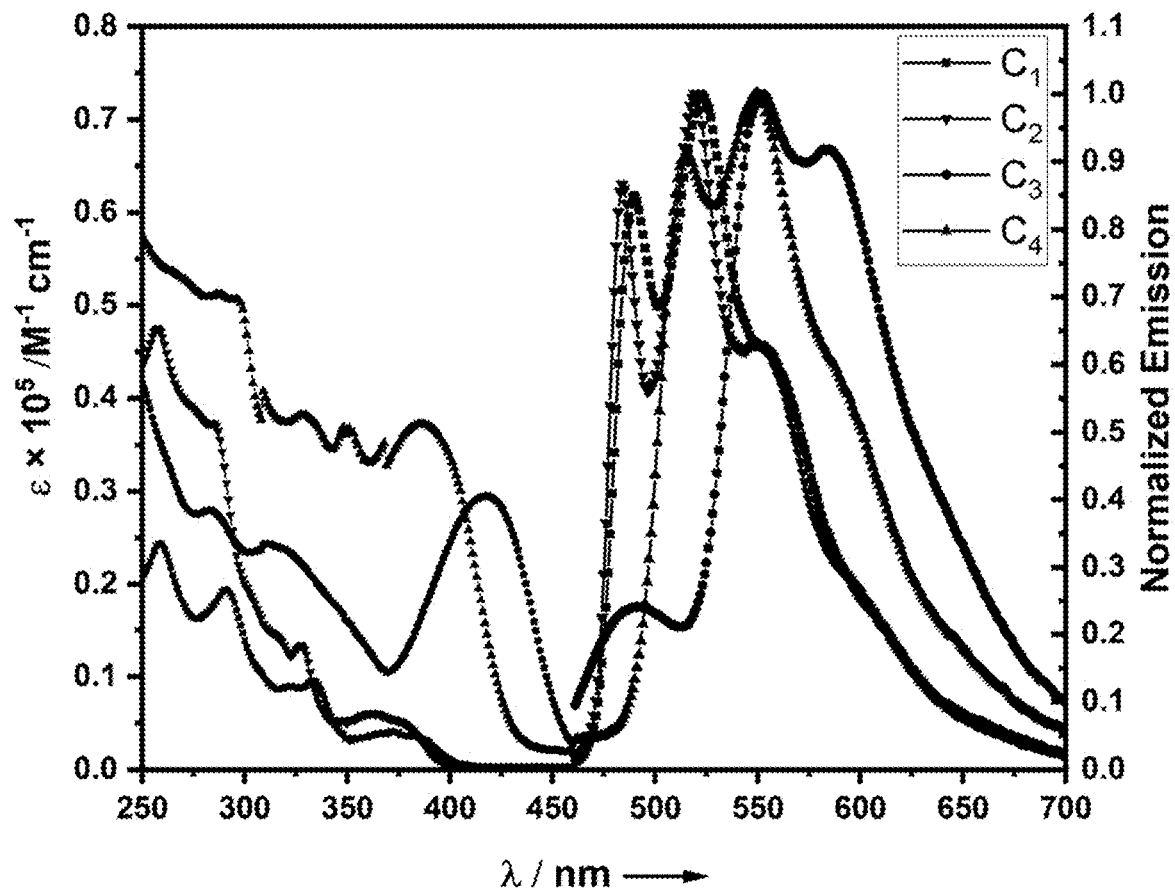
FIG. 2 shows an ultraviolet-visible absorption spectrum of the platinum complex $C_1$, the platinum complex $C_2$, the platinum complex $C_3$ and the platinum complex $C_4$ of the present disclosure in the solution state at 25° C.
Figure 3:
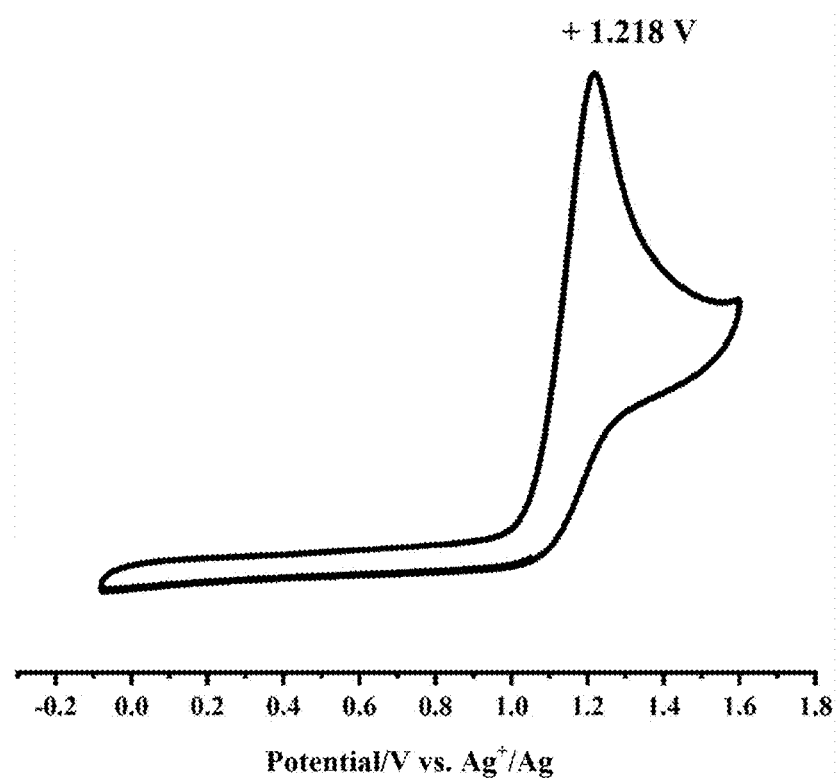
FIG. 3 shows a cyclic voltammetry curve of the platinum complex $C_2$ of the present disclosure.
Figure 4:
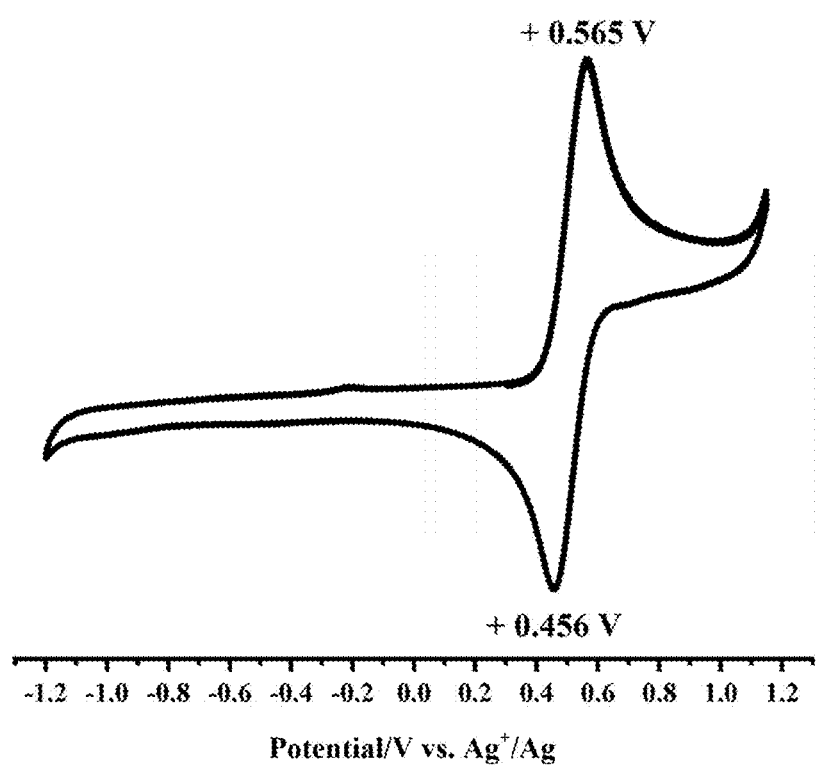
FIG. 4 shows a cyclic voltammetry curve of the platinum complex $C_3$ of the present disclosure.
Figure 5:
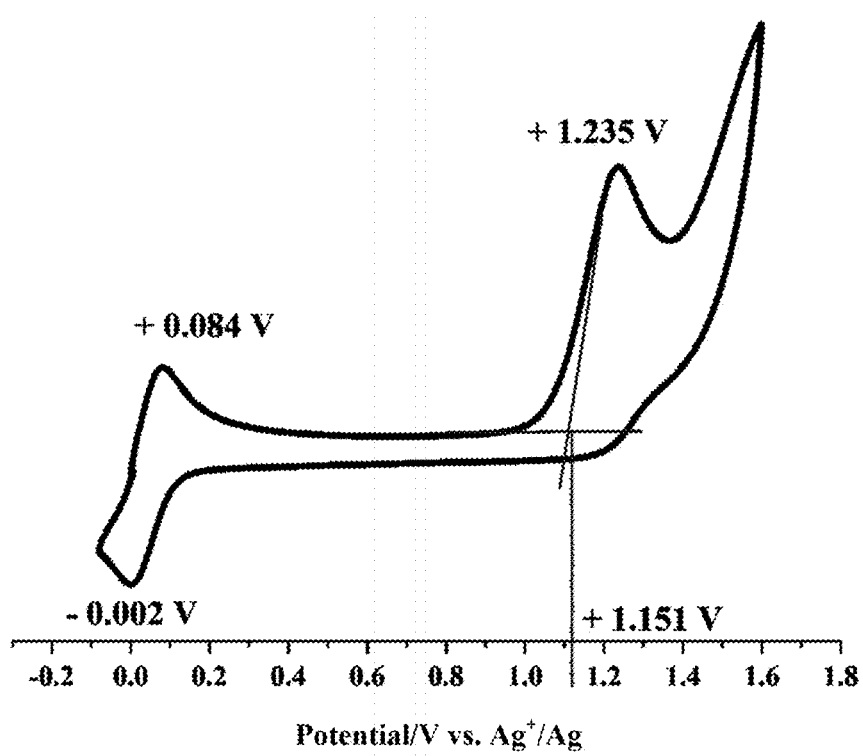
FIG. 5 shows a CLUMO energy level cyclic voltammetry curve calculated from cyclic voltammetry and UV-Vis spectrum by using ferrocene as an internal standard for the platinum complex $C_2$ of the present disclosure, calculating HOMO energy level from cyclic voltammogram.

The present disclosure provides a monocarborane cluster-containing platinum complex. The complex belongs to a phosphorescent material, and has excellent luminous efficiency, high electron mobility and long luminous lifespan. The complex has a general structural formula selected from the group consisting of the following general structural formulas:

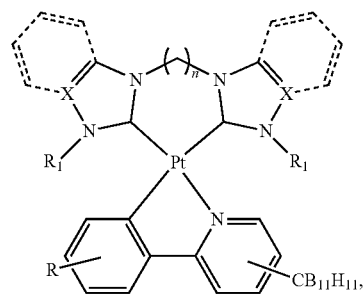

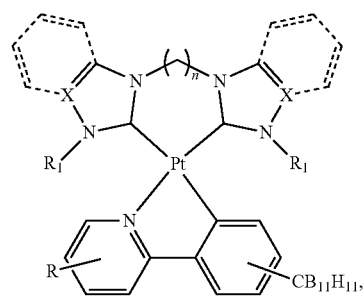

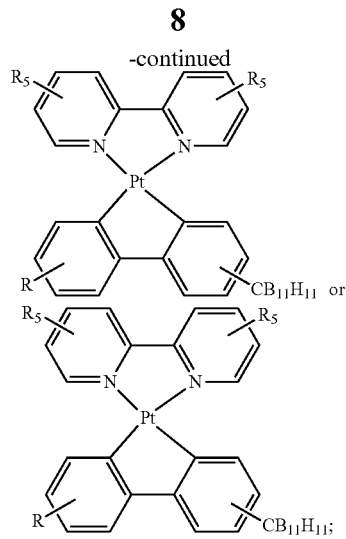

where each R and $R_5$ are independently any one selected from the group consisting of —$CH_3$, H, tert-butyl and aryl; where aryl is any one selected from the group consisting of phenyl, carbazole

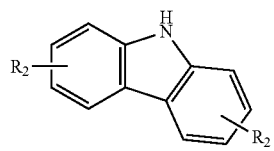

and aniline

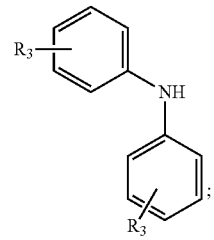

where $R_2$ in general structural formulas of carbazole and aniline is any one selected from the group consisting of methyl, tert-butyl and phenyl; —$R_1$ is selected from the group consisting of $C_{4-12}$ linear alkyl; n is 1 to 3; X is an element of C or N; when the ligand of the general structural formula is benzimidazole or imidazole, X is C element; when the ligand of the general structural formula is triazole, X is N element; —$CB_{11}H_{11}$ is monocarborane with a structure of

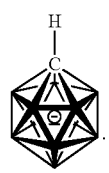

The present disclosure further provides a method for preparing the monocarborane cluster-containing platinum complex, comprising:

heating a organometallic compound I or a complex VII to 60° C. in a first solvent, conducting a reaction with silver trifluoromethanesulfonate in the dark for 1 h to obtain the reaction product, and then adding a compound III or a compound IV and an alkali to the reaction product, and conducting a reaction under N$_2$ protection to obtain a reaction mixture; cooling the reaction mixture to room temperature, filtering, rotary evaporating to removing the first solvent, and purifying by column chromatography isolation to obtain the monocarborane cluster-containing platinum complex;

where the compound I and the compound VII have the following structural formulas:

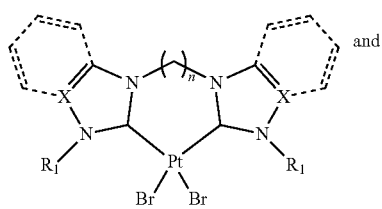

(I)

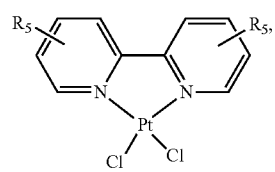

(VII)

and the compound III and the compound IV have the following structural formulas:

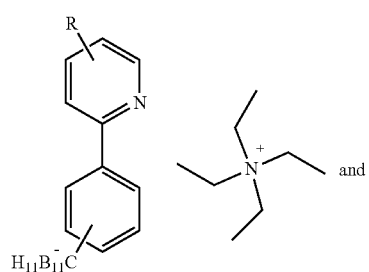

(III)

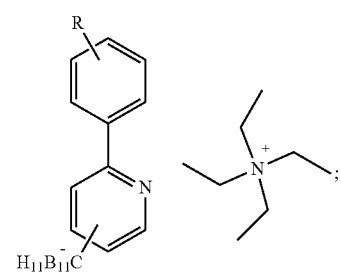

(IV)

the first solvent is a mixture of dichloromethane and tetrahydrofuran; a molar ratio of the compound I or the complex VII to the borane-containing ligand is in a range of 1:(1.1-1.2), preferably 1:(1-1.1) or 1:1; a ratio of the compound I to the first solvent is in a range of 1 mmol:(80-150) mL, preferably 1 mmol:(100-120) mL.

In one embodiment, the compound I and the complex VII are performed by the following steps:

adding a compound II and a compound VIII separately to a second solvent, and heating for a reaction under N$_2$ protection for 10 h; the compounds II and VIII have the following structural formulas:

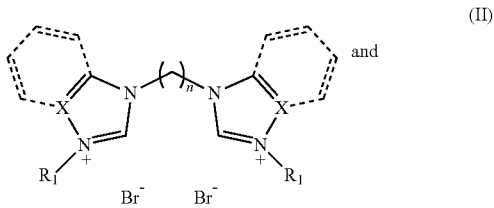

(II)

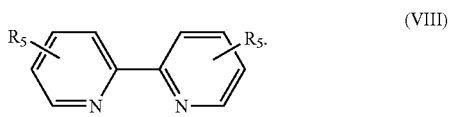

(VIII)

The platinum compound comprises platinum acetylacetonate and potassium tetrachloroplatinate; the second solvent is dimethyl sulfoxide or a mixture of hydrochloric acid and chloroform (at mixing ratio of 4:1); a ratio of the compound II to the second solvent is in a range of 1 mmol: (80-150) mL, preferably 1 mmol: (100-120) mL.

In some embodiments, both a molar ratio of compound II to platinum acetylacetonate, and a molar ratio of compound VIII to potassium tetrachloroplatinate are 1:1.1.

In the present disclosure, the compound I is performed by the following steps:

step 10, adding a compound II and a platinum compound into a second solvent, and heating for a reaction under N$_2$ protection for 10 h to obtain a mixture I; and step 11, subjecting the mixture I to a reduced pressure distillation, extracting with dichloromethane, washing with water to obtain an organic phase, collecting the organic phase, drying with anhydrous magnesium sulfate, evaporating the second solvent, purifying by column chromatography isolation and drying to obtain the compound I.

In the present disclosure, the compound VII is performed by the following steps:

step 12, adding a compound VIII and a platinum compound into a second solvent, and heating for a reaction under N$_2$ protection for 10 h to obtain a mixture II; and step 13, filtering the mixture II to obtain a filtrate, and washing the filtrate with water, n-hexane and methanol in sequence to obtain the compound VII;

the compound II and the compound VIII have the following structural formulas:

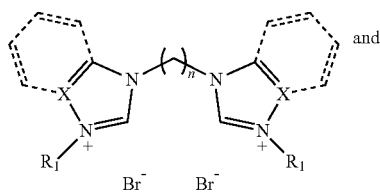

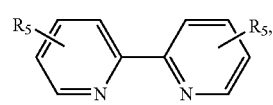

the corresponding platinum compound of the compound II is platinum acetylacetonate; the corresponding platinum compound of the compound VIII is potassium tetrachloroplatinate; each the second solvent independently is dimethyl sulfoxide and a mixture of hydrochloric acid and chloroform with a mixing ratio of 4:1, where the solvent for the compound II is dimethyl sulfoxide, and in step 10, the heating is conducted at 110° C.; the solvent for the compound VIII is the mixture of the hydrochloric acid and the chloroform with a mixing ratio of 4:1, and in step 12, the heating is conducted at 60° C.

In the present disclosure, the compound III and the compound IV are performed by the following steps:

step 20, putting carborane into a third solvent and adding n-butyl lithium, and then adding cuprous iodide after 1.5 h, and conducting a reaction for 40 min;

step 21, adding a palladium catalyst, a phosphorus ligand, and a compound V or a compound VI into the reaction product obtained from step 20, and conducting a reaction at room temperature for 20-24 h under $N_2$ protection; and step 22, cooling the reaction product obtained from step 21 to room temperature, conducting a suction filtration with diatomaceous earth to obtain a filtrate, extracting the filtrate with ether after rotary evaporation, washing with hydrochloric acid to obtain an organic phase, spin-drying the organic phase, and purifying by cation exchange and column chromatography isolation to obtain the compound III and the compound IV; the compound V and the compound VI have the following structural formulas:

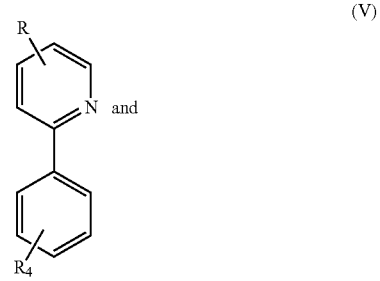

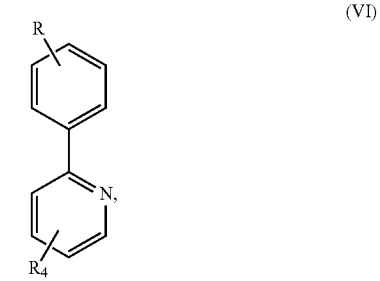

$R_4$ is a halogen group; the third solvent is tetrahydrofuran; the palladium catalyst is palladium acetate; the phosphorus ligand is tris(2-methoxyphenyl)phosphine; a molar ratio of carborane and the compound V or the compound VI is 1:1.1.

Specifically, a synthetic process for preparing the platinum complex from the compound II and the compound V is performed as follows:

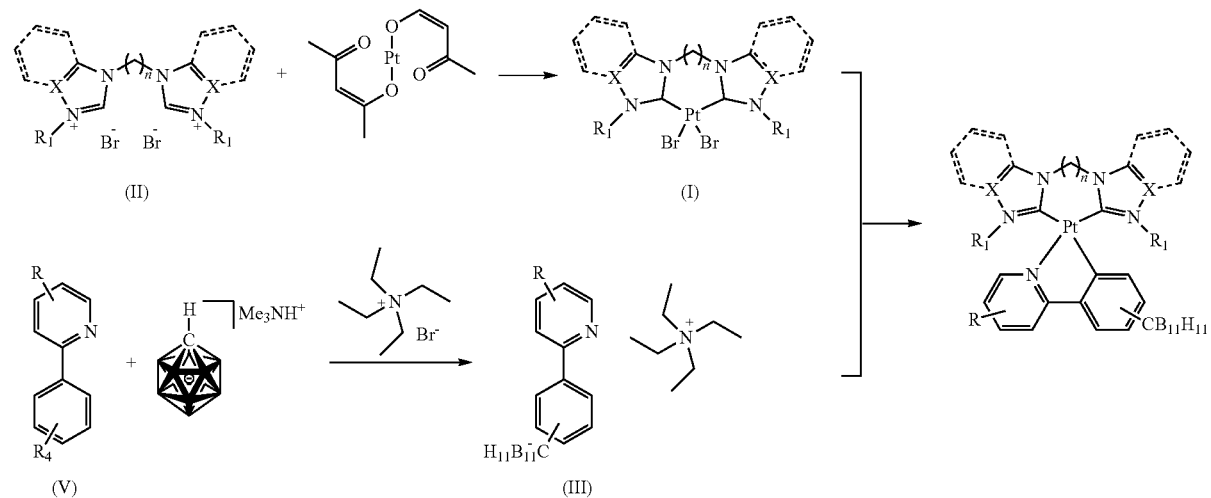

Specifically, a synthetic process for preparing the platinum complex from the compound II and the compound VI is performed as follows:
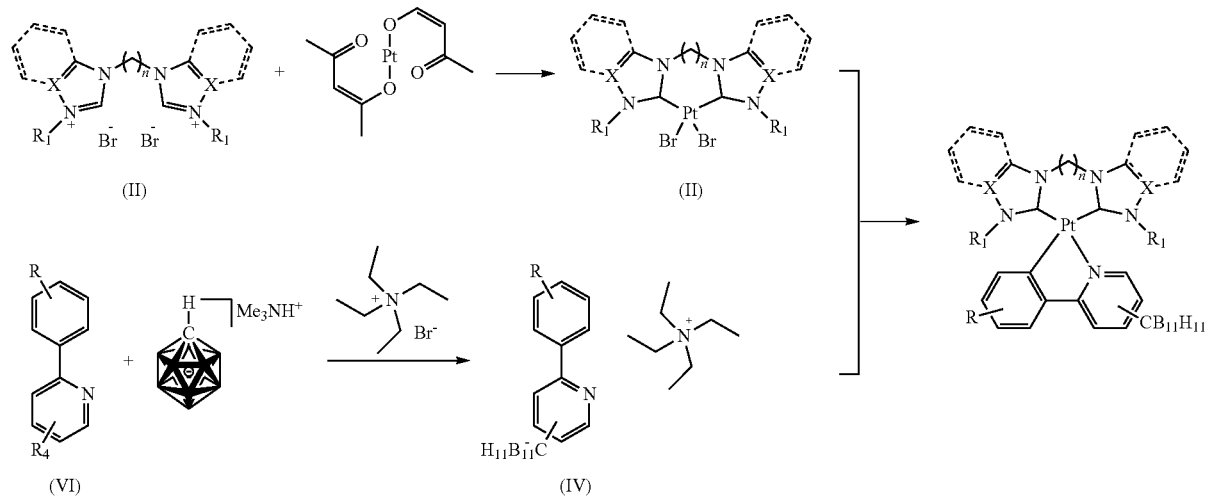
Specifically, a synthetic process for preparing the platinum complex from the compound VIII and the compound V is performed as follows:
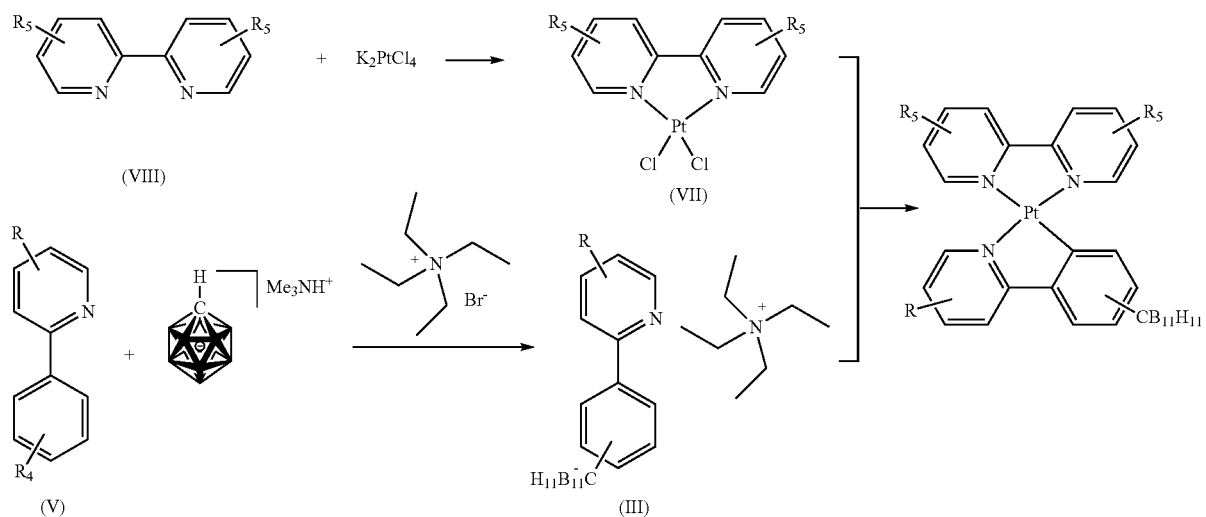

Specifically, a synthetic process for preparing the platinum complex from the compound VIII and the compound VI is performed as follows:

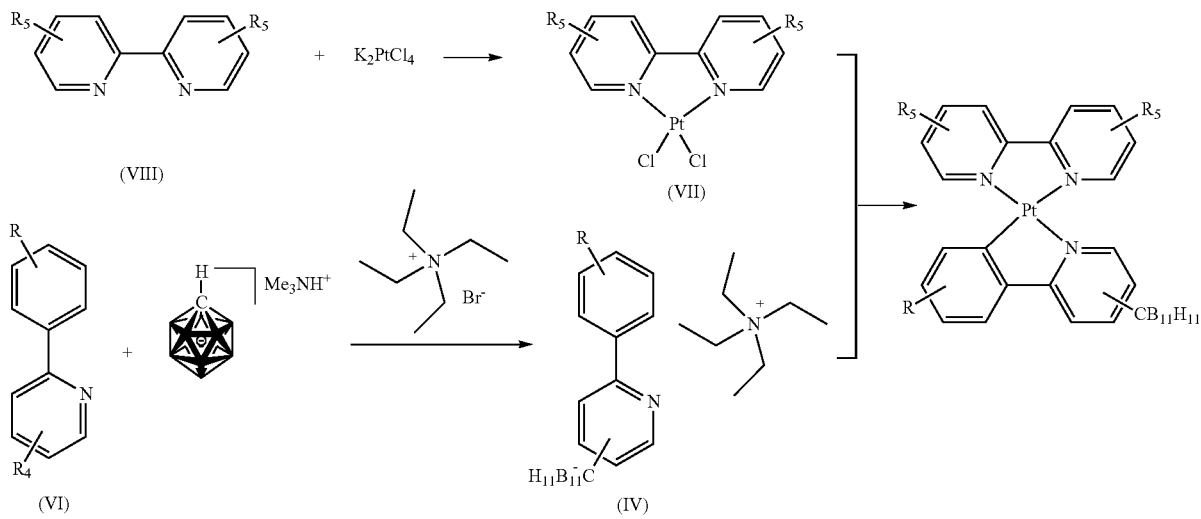

The present disclosure further provides use of any one of the above platinum complexes in OLEDs.

The present disclosure further provides an OLED, comprising any one of the above platinum complexes.

In some embodiments, the OLED comprises an emission layer, and the emission layer comprises any one of the above platinum complexes.

In order to make the present disclosure clearer, the present disclosure will be further explained below with reference to specific examples. Descriptions of well-known functions and constructions are omitted for clarity and conciseness.

Example 1

This example provided a platinum complex $C_1$ with a structural formula as follows:

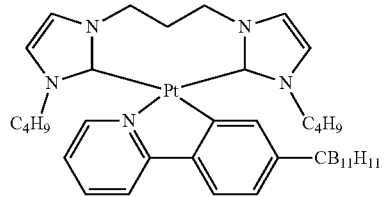

$C_1$

A synthetic route of the platinum complex $C_1$ was performed as follows:

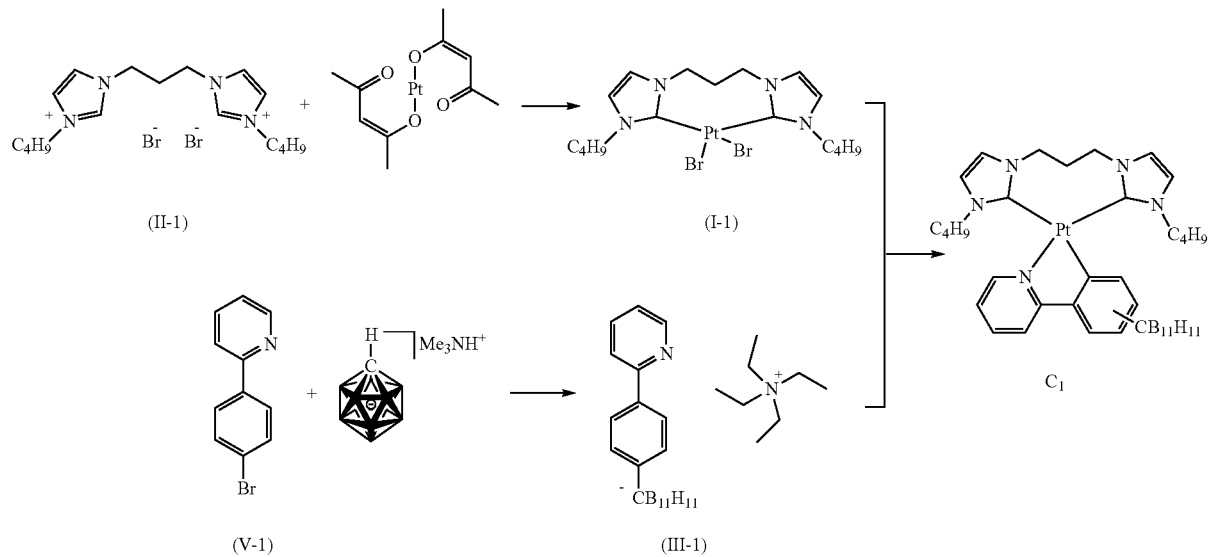

The specific preparation steps were performed as follows:

(i) Platinum acetylacetonate (2 g, 5.09 mmol) was placed in a two-necked flask; 5 mL of dimethyl sulfoxide was added under a nitrogen atmosphere, obtaining a reaction system; ligand II-1 (2.47 g, 5.49 mmol) was dissolved in 20 mL of dimethyl sulfoxide, placed in a 100 mL constant-pressure funnel and slowly added dropwise to the reaction system within three hours, obtaining a mixture; the mixture was refluxed under $N_2$ for 10 h, obtaining a reaction mixture; the reaction mixture was cooled to room temperature; all solvent were removed by reduced pressure distillation, obtaining a residue, and then the residue was extracted with dichloromethane, washed with water, dried with magnesium sulfate, filtered and evaporated to dryness, obtaining a crude product; the obtained crude product was purified by silica gel column chromatography, obtaining a compound I-1 as a white solid.

(ii) Carborane (600 mg, 3.0 mmol) was placed in a nitrogen atmosphere, dissolved in 25 mL of anhydrous tetrahydrofuran and stirred; 6 mL of n-butyl lithium was added under an ice bath, obtaining a reactant; the reactant was subjected to a reacted for 1.5 h under stirring; and then cuprous iodide (628 mg, 3.3 mmol) was added for a reaction for 40 min; and then palladium acetate (80 mg, 0.33 mmol), tris(2-methoxyphenyl)phosphine (348 mg, 1 mmol) and 2-(4-bromophenyl)pyridine (772 mg, 3.3 mmol) were added and stirred under a nitrogen atmosphere for 12 h, obtaining a product. After the reaction was completed, the product was filtered with diatomaceous earth, washed with dichloromethane several times, obtaining a filtrate; the filtrate was spin-dried, and then extracted with methyl tert-butyl ether and washed with 1 mol/L hydrochloric acid, obtaining an ether layer; the ether layer was spin-drying; the resulting product was neutralized in water until the aqueous solution was alkaline; tetraethylammonium bromide was added to form a white precipitated product III-1.

(iii) The I-1 (100 mg, 0.15 mmol) was dissolved in a mixed solution of 12 mL of dichloromethane and 6 mL of tetrahydrofuran under a nitrogen atmosphere; silver trifluoromethanesulfonate (81 mg, 0.32 mmol) was added in the dark and stirred at 60° C. for 1 h until a precipitate was observed. The compound III-1 (70 mg, 0.16 mmol) was added and stirred for 0.5 h; potassium tert-butoxide (34 mg, 0.30 mmol) was added, obtaining a mixture; the mixture was refluxed under $N_2$ at 60° C. for 5 h, obtaining a product. The product was filtered, obtaining a precipitate and a filtrate; the filtrate was spin-dried, obtaining a crude product; the crude product was purified by silica gel column chromatography, obtaining a platinum complex $C_1$.

Example 2

This example provided a platinum complex $C_2$ with a structural formula as follows:

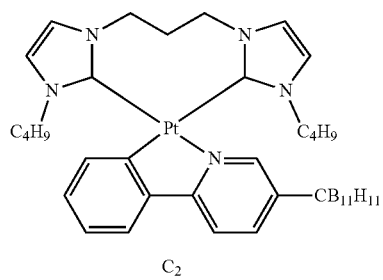

A synthetic route of the platinum complex $C_2$ was performed as follows:

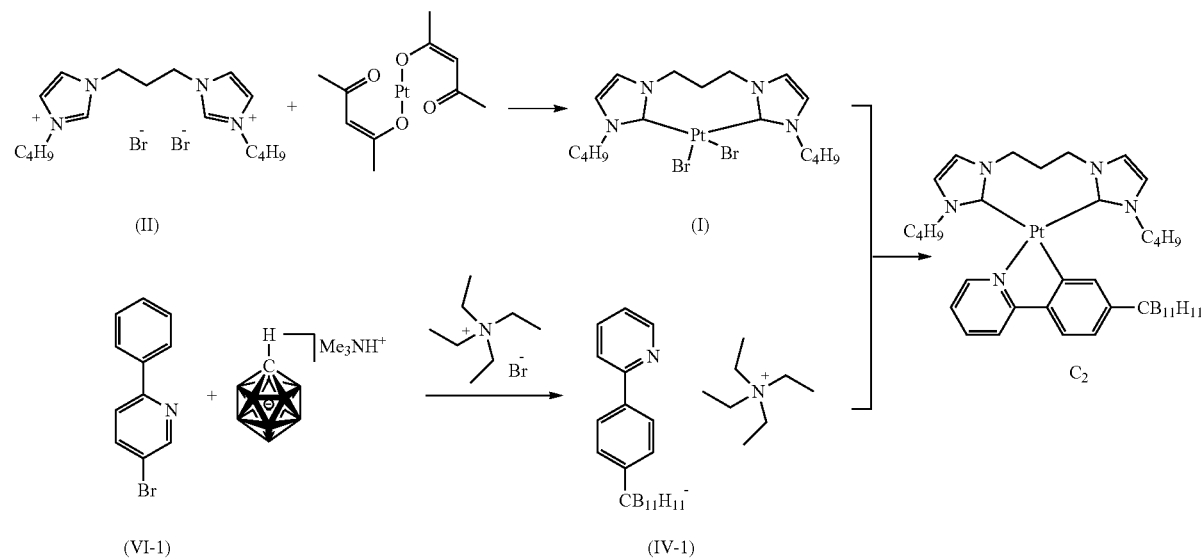

The specific preparation steps were performed as follows:
The specific preparation steps referred to Example 1, and the difference was only that 2-(4-bromophenyl)pyridine in step (i) was replaced with 5-bromo-2-phenylpyridine.

Example 3

This example provided a platinum complex $C_3$ with a structural formula as follows:

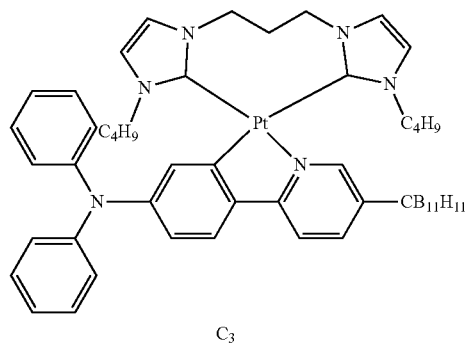

$C_3$

A synthetic route of the platinum complex $C_3$ was performed as follows:

The specific preparation steps were performed as follows:
The specific preparation steps referred to Example 1, and the difference was only that the compound V-1 was replaced with a compound VI-2.

Example 4

This example provided a platinum complex $C_4$ with a structural formula as follows:

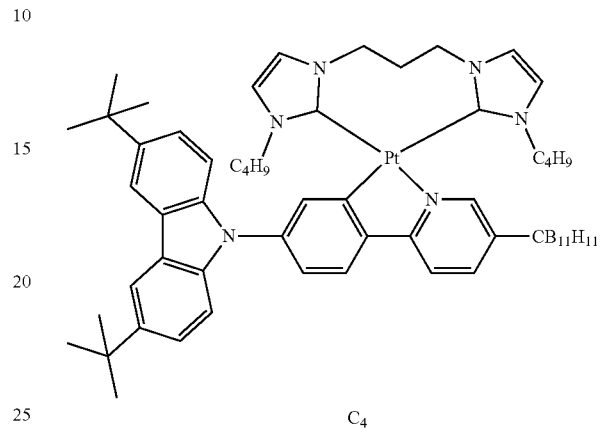

$C_4$

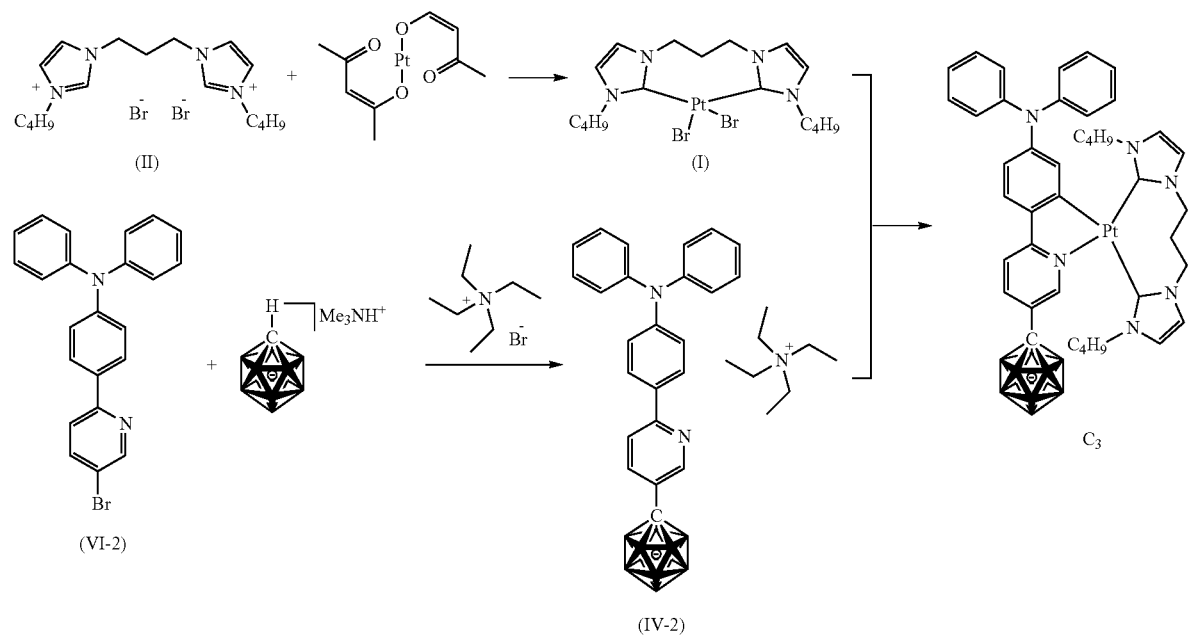

A synthetic route of the platinum complex $C_4$ was performed as follows:
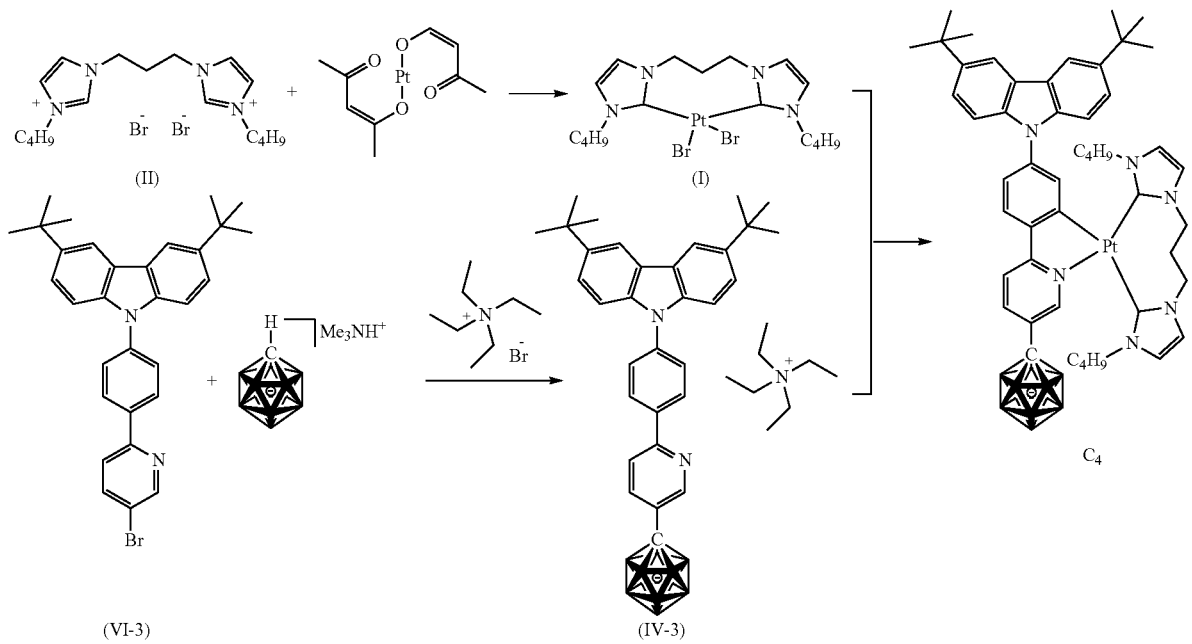
The specific preparation steps were performed as follows:
The specific preparation steps referred to Example 1, and the difference was only that the compound V-1 was replaced with a compound VI-3.
Example 5
This example provided a platinum complex $C_5$ with a structural formula as follows:
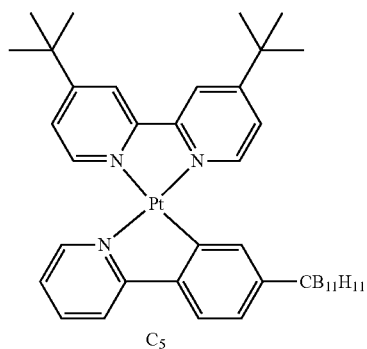

A synthetic route of the platinum complex C₅ was performed as follows:

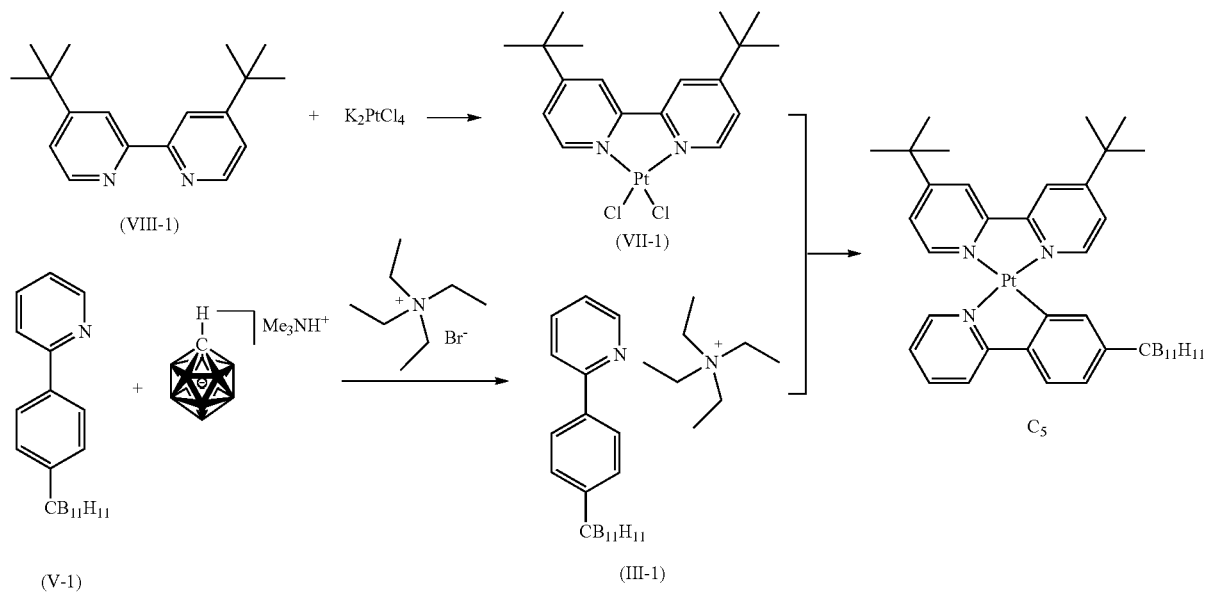

The specific preparation steps were performed as follows:

(i) 4,4'-di-tert-butyl-2,2'-dipyridine (1 g, 3.73 mmol) and potassium tetrachloroplatinate (1.7 g, 4.10 mmol) were placed in an eggplant-shaped flask; 5 mL of chloroform and 15 mL of 4M hydrochloric acid were added under a nitrogen atmosphere, obtaining a mixture; the mixture was refluxed under $N_2$ for 10 h, obtaining a reaction mixture. The reaction mixture was cooled to room temperature and filtered, and washed with water, n-hexane and methanol in sequence.

Steps (ii) and (iii) referred to Example 1.

The prepared platinum complex $C_1$, the platinum complex $C_2$ and the platinum complex $C_3$ each was dissolved in acetonitrile.

The luminescence properties of the platinum complex $C_1$, the platinum complex $C_2$, the platinum complex $C_3$ and the platinum complex $C_4$ prepared by the present disclosure in the above different states were summarized below, respectively, as shown in Table 1. Table 1 showed the photophysical properties of the platinum complex $C_1$, the platinum complex $C_2$, the platinum complex C, and the platinum complex $C_4$ prepared by the present disclosure.

TABLE 1

| Complex | Absorption (CH₂Cl₂) | Medium (T/K) | Emission Wavelength/nm | Quantum yield (%)[a] | τ (μs) | $k_r$ [10⁴ S⁻¹] | $k_{nr}$ [10⁵ S⁻¹] |
|---|---|---|---|---|---|---|---|
| $C_1$ | 259 (24437), 291 (19436), 334(8646), 386 (3033) | CH₂Cl₂ (298)[b] | 490, 522, 553 sh | 58 | 12.08 | 4.8 | 0.35 |
| | | Solid (298) | 491, 524, 553sh | 68 | 20.38 | 3.3 | 0.16 |
| | | PMMA (298)[c] | 491, 524, 553sh | 94 | 12.08 | 7.8 | 0.048 |
| $C_2$ | 258 (47543), 285 (37288), 328 (13342), 375 (5211) | CH₂Cl₂ (298)[b] | 484, 519, 549sh | 48 | 8.41 | 5.7 | 0.62 |
| | | Solid (298) | 489, 522, 549sh | 73 | 15.84 | 4.6 | 0.17 |
| | | PMMA (298)[c] | 483, 518, 547sh | 97 | 10.87 | 8.9 | 0.030 |
| $C_3$ | 284 (27950), 311 (24333), 421 (29219)) | CH₂Cl₂ (298)[b] | 492, 552, 585 | 12 | 3.28 | 3.7 | 2.7 |
| | | Solid (298) | 510, 580 | 15 | 2.01 | 7.5 | 4.2 |
| | | PMMA (298)[c] | 466, 542, 577 | 73 | 1.50 | 49 | 1.8 |
| $C_4$ | 298sh (50265), 329 (38145), 386 (37268)) | CH₂Cl₂ (298)[b] | 515, 549 | 45 | 13.14 | 3.4 | 0.42 |
| | | Solid (298) | 449, 509, 5450 | 65 | 2.82 | 23 | 1.3 |
| | | PMMA (298)[c] | 509, 543 | 94 | 37.25 | 2.5 | 0.050 |

The phosphorescence quantum yield was measured using an integrating sphere in $N_2$-degassed dichloromethane. The measurement was conducted with a 2 wt % polymethylmethacrylate film on a quartz plate. The radiative rate constant ($k_r$) and the non-radiative rate constant ($k_{nr}$) were estimated using the following equations. $k_r=\varphi/\tau$, and $k_{nr}=(1-\varphi)/\tau$.

Notes: in the table, "Em" represented "emission wavelength"; "Φ" represented "phosphorescence quantum yield"; "τ" represented "phosphorescence lifetime"; "Solid" represented "solid state"; "PMMA" represented "PMMA film state"; "Liquid" represented "solution state".

Organic Electroluminescent Device Examples:

The structure of an organic electroluminescent device (OLED) is generally a sandwich structure composed of a metal anode, an organic functional layer and a metal cathode. The whole structure layer comprises: a hole transport layer (HTL), an emitting layer (EL) and an electron transport layer (ETL). The anode generally adopts a thin and transparent layer of indium tin oxide (ITO) with semiconductor properties. The application effect of the metal platinum complex $C_2$ synthesized by the present disclosure as the host material of the emitting layer in the device will be described in detail through Device Example 1 below. The test results of the obtained devices are shown in Table 2.

Device Example 1

In Device Example 1, an organic electroluminescent device was provided and prepared by the following steps:

The device adopted a traditional indium tin oxide (ITO) device structure, and the device structure was as follows: ITO/PEDOT:PSS/YJ001:PYD-2Cz/DPEPO(10 nm)/TPBi (40 nm)/LiF (1 nm)/Al(100 nm).

Figure 6:
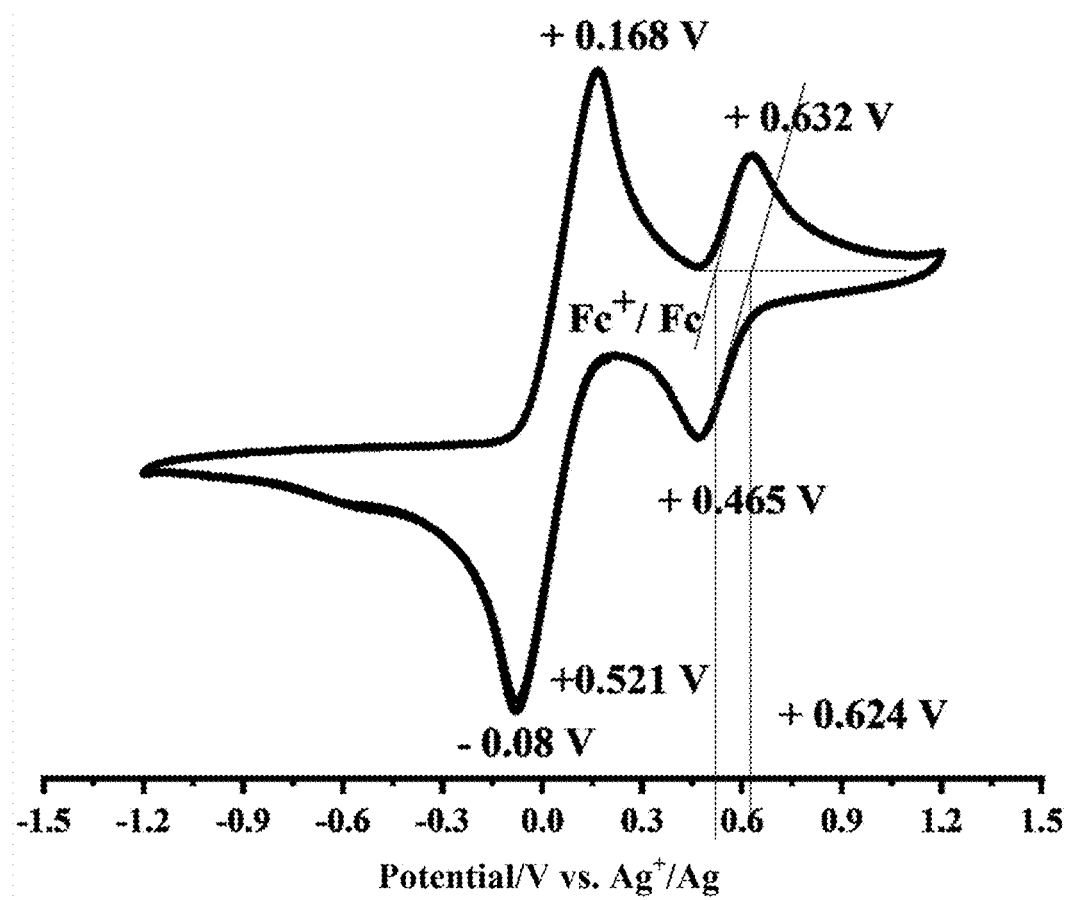
FIG. 6 shows a CLUMO energy level cyclic voltammetry curve calculated from cyclic voltammetry and UV-Vis spectrum by using ferrocene as an internal standard for the platinum complex $C_3$ of the present disclosure, calculating HOMO energy level from cyclic voltammogram.
Figure 7A:
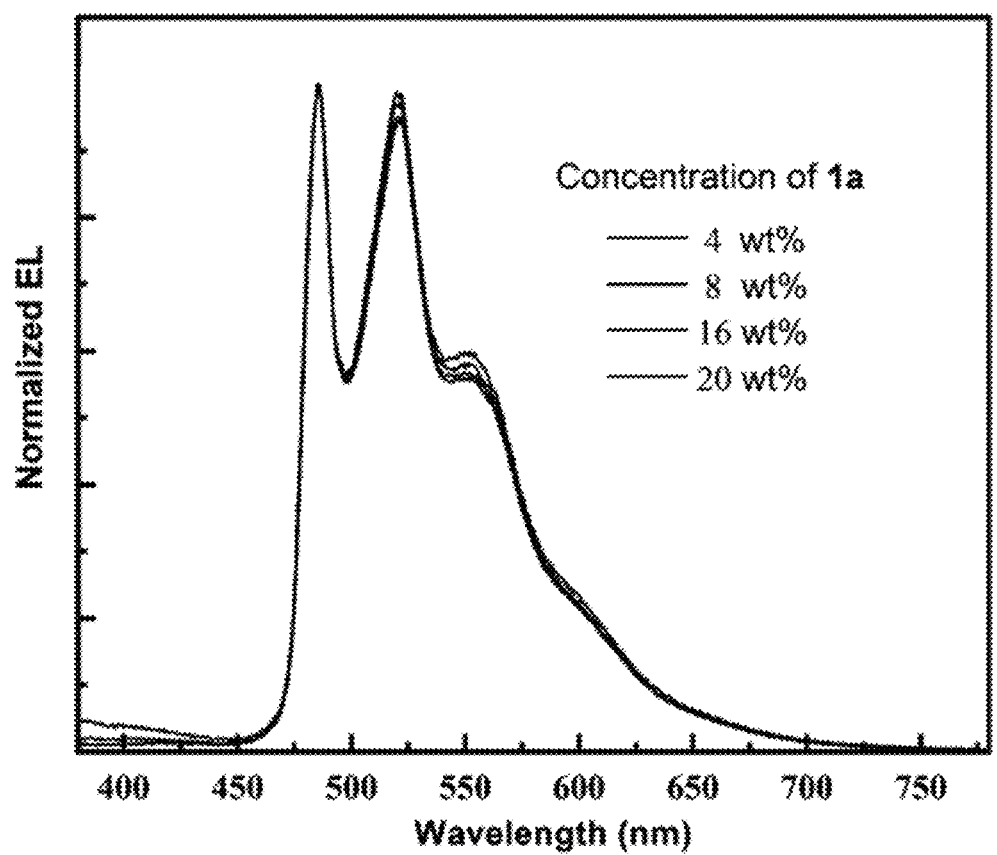
Figure 7B:
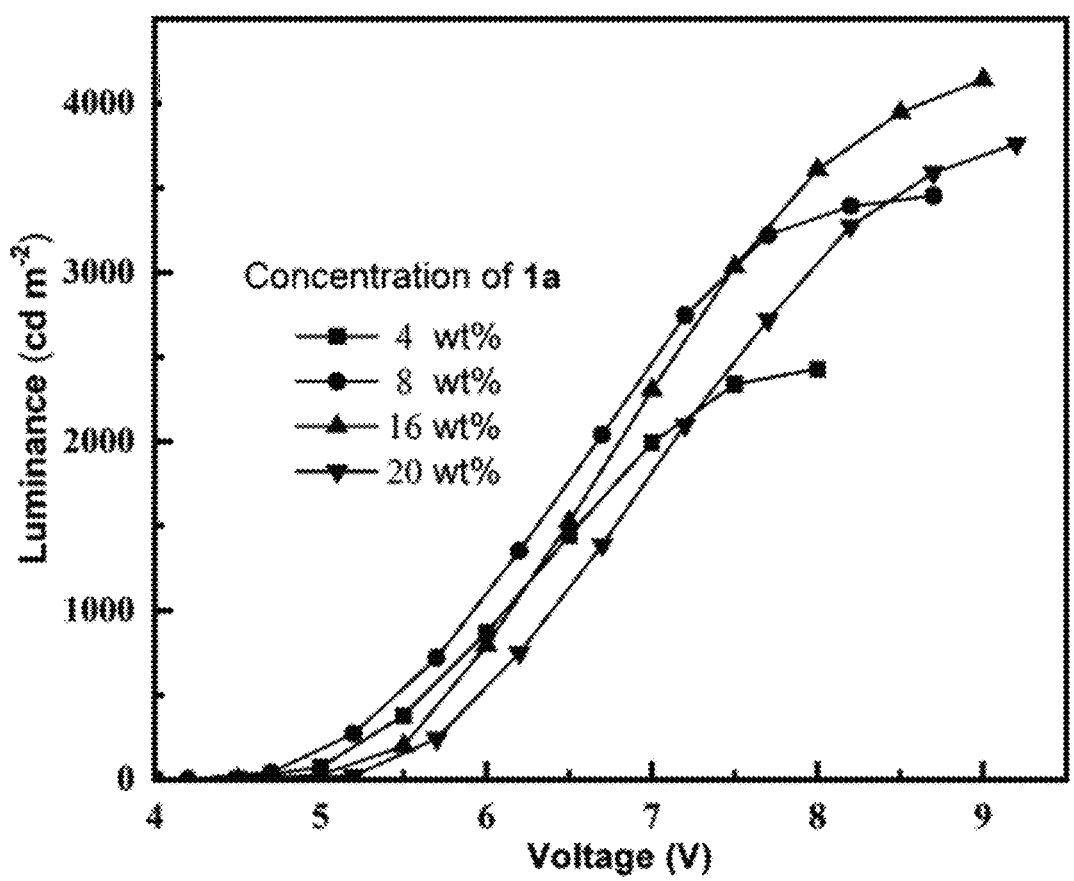
Figure 7C:
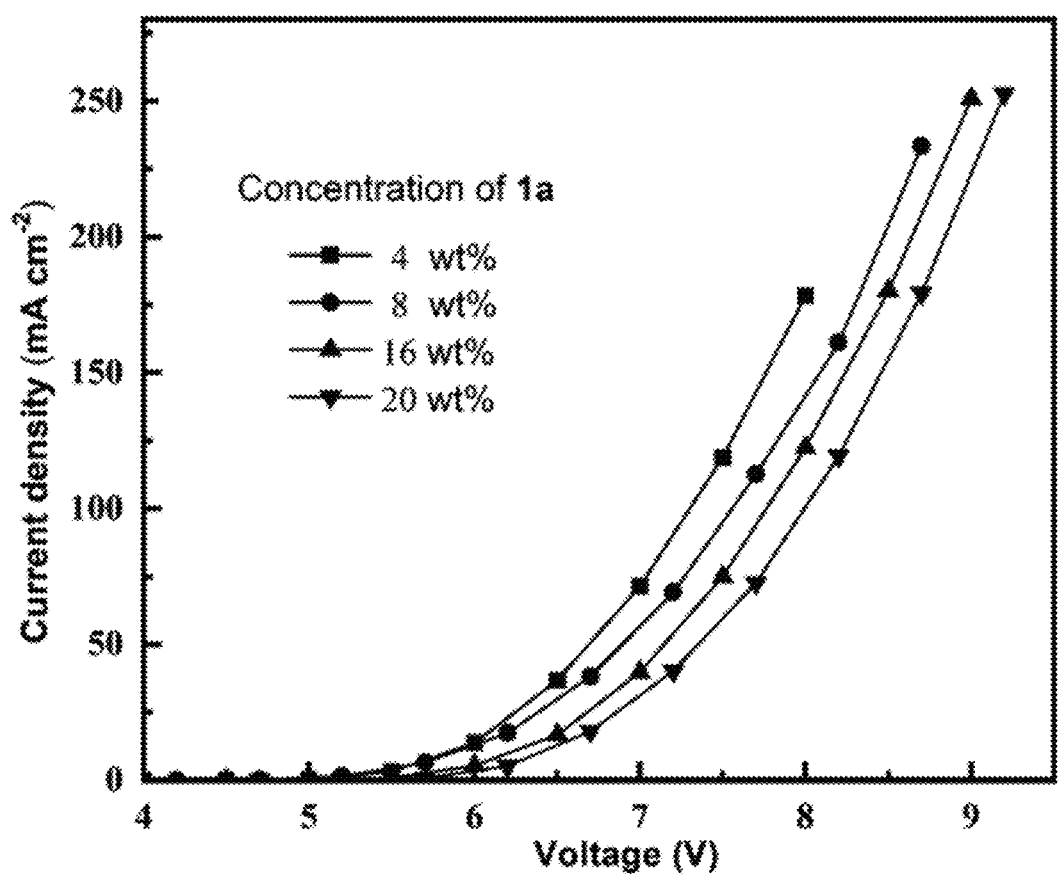
Figure 7D:
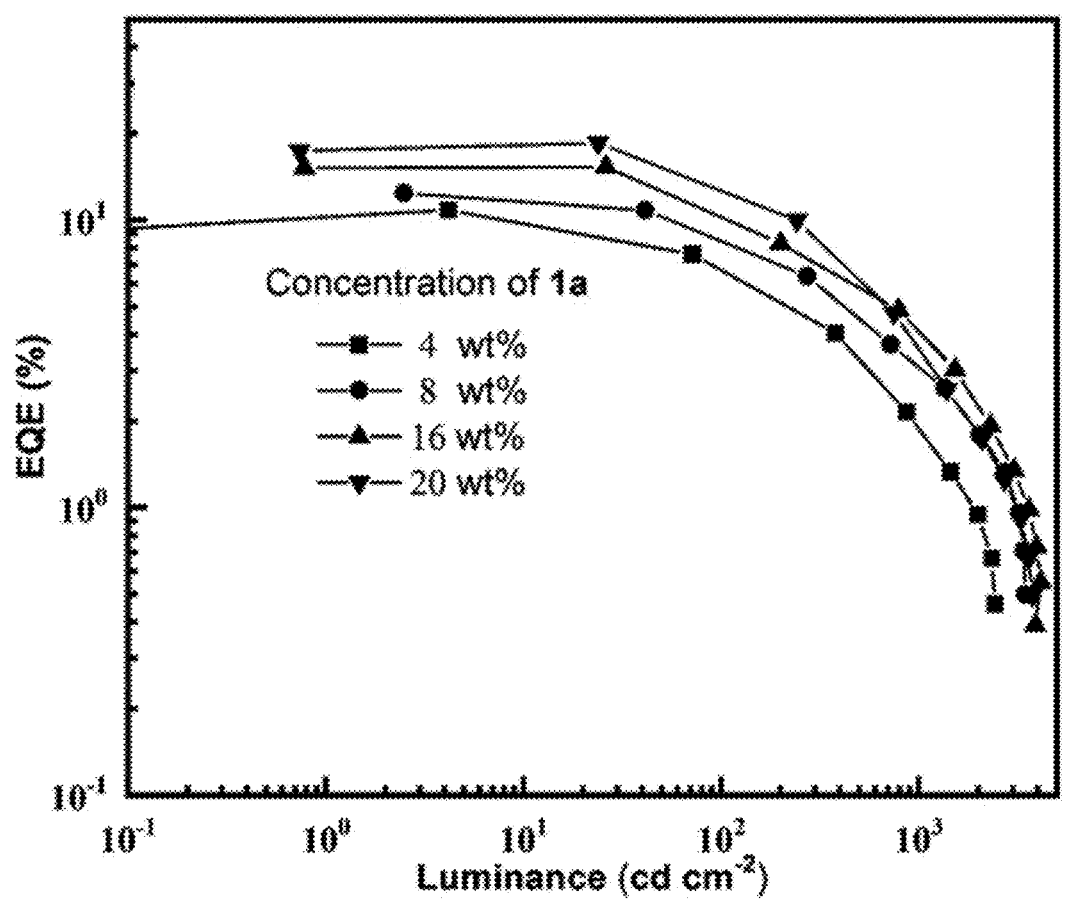
Figure 8:
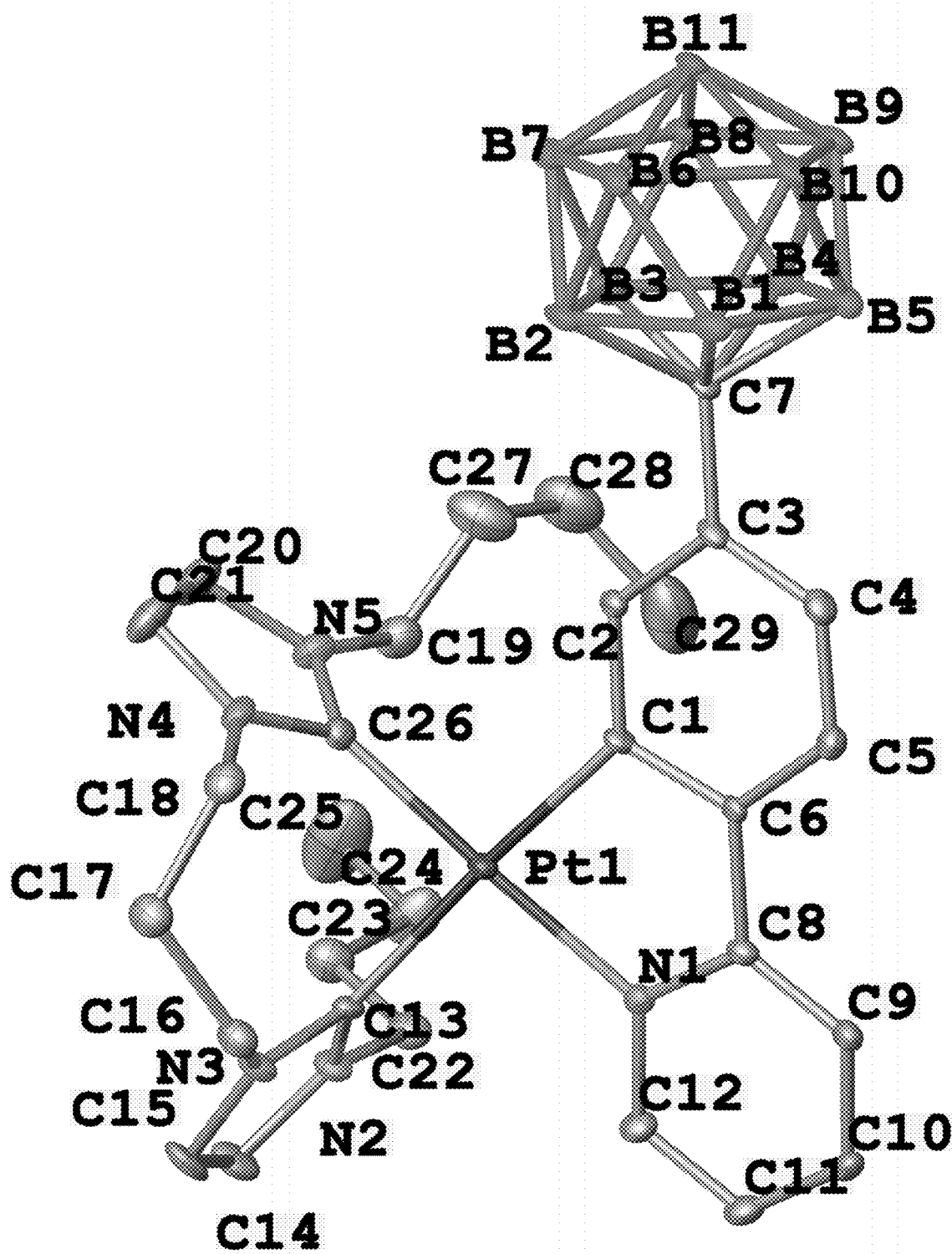
FIG. 8 shows a structural diagram of the structural characterization data of the platinum complex $C_2$ of the present disclosure.
Figure 9:
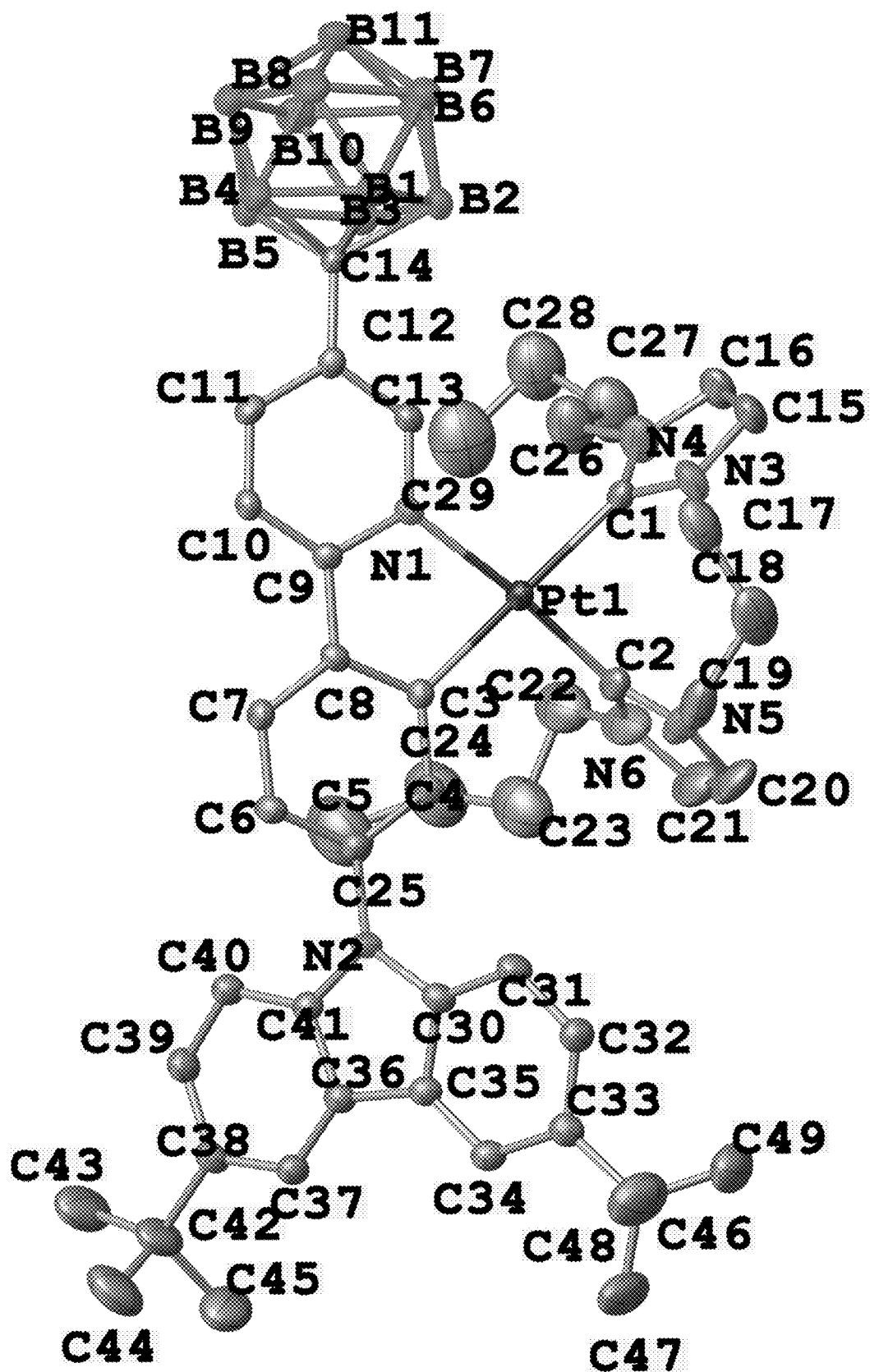
FIG. 9 shows a structural diagram of the structural characterization data of the platinum complex $C_4$ of the present disclosure.
Figure 10:
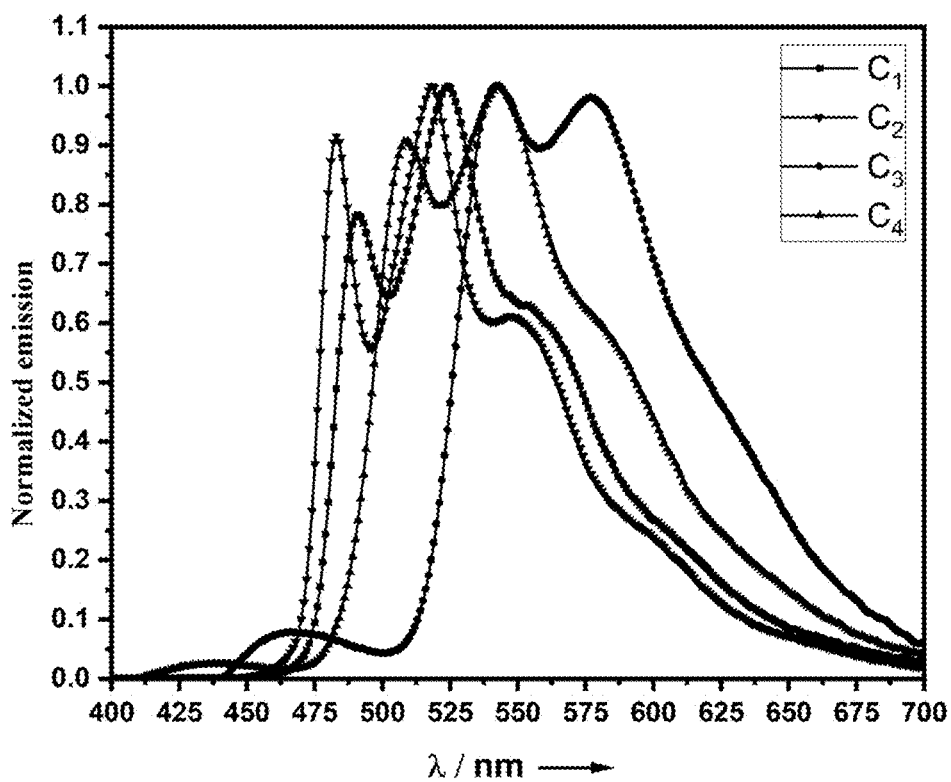
FIG. 10 shows normalized emission spectra of the platinum complex $C_1$, the platinum complex $C_2$, the platinum complex $C_3$ and the platinum complex $C_4$ in a 2 wt %-doped polymethyl methacrylate (PMMA) film at 25° C.
Figure 11:
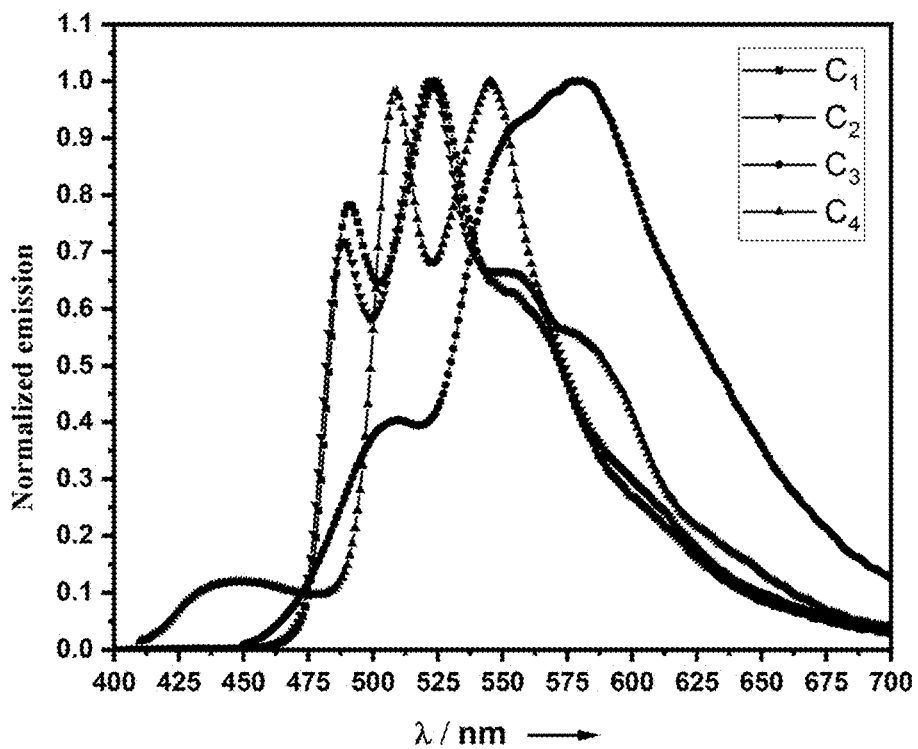
FIG. 11 shows normalized emission spectra of the platinum complex $C_1$, the platinum complex $C_2$, the platinum complex $C_3$ and the platinum complex $C_4$ in a solid powder state at 25° C.
Figure 12:
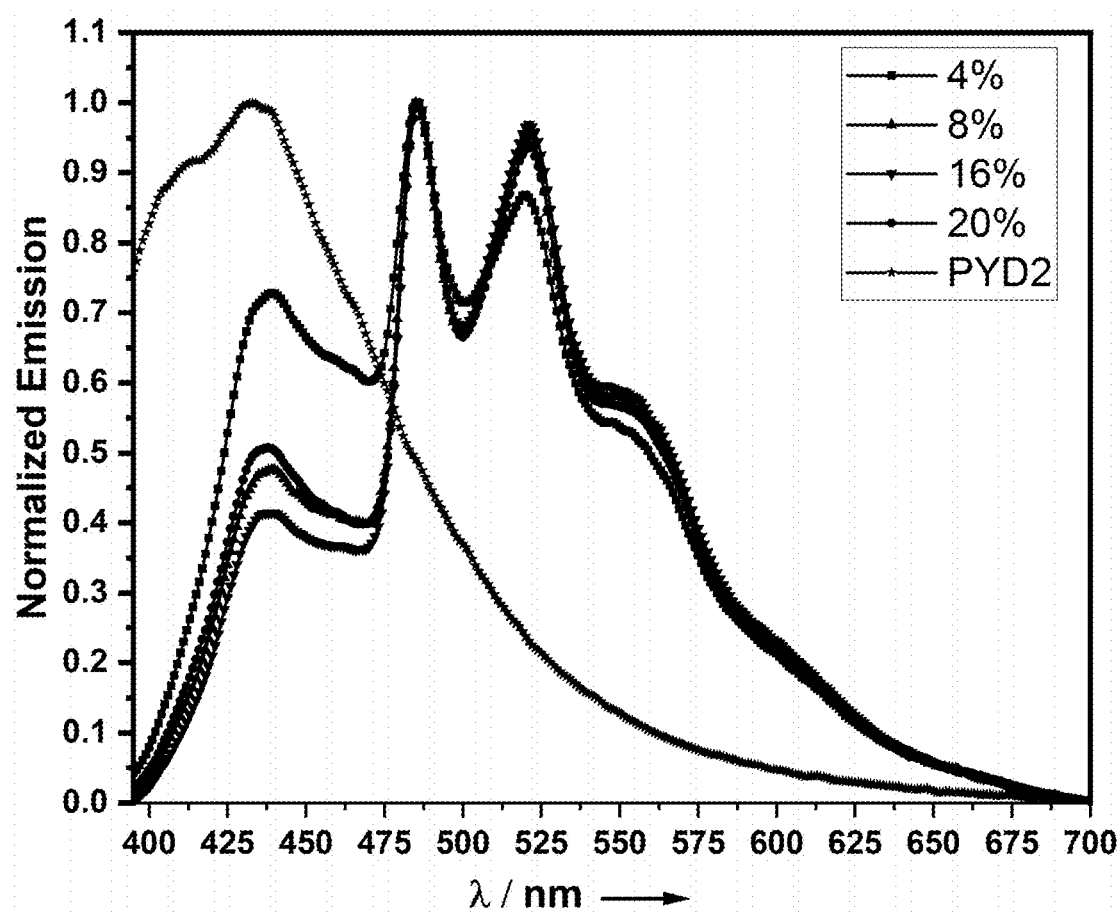
FIG. 12 shows a normalized emission spectrum of the platinum complex $C_2$ of the present disclosure in PYD2 films with different doping concentrations of 2 wt %, 4 wt %, 8 wt % 16 wt %, and 20 wt % at 25° C., and a normalized emission spectrum in a pure PYD2 film at 25° C.
Figure 13:
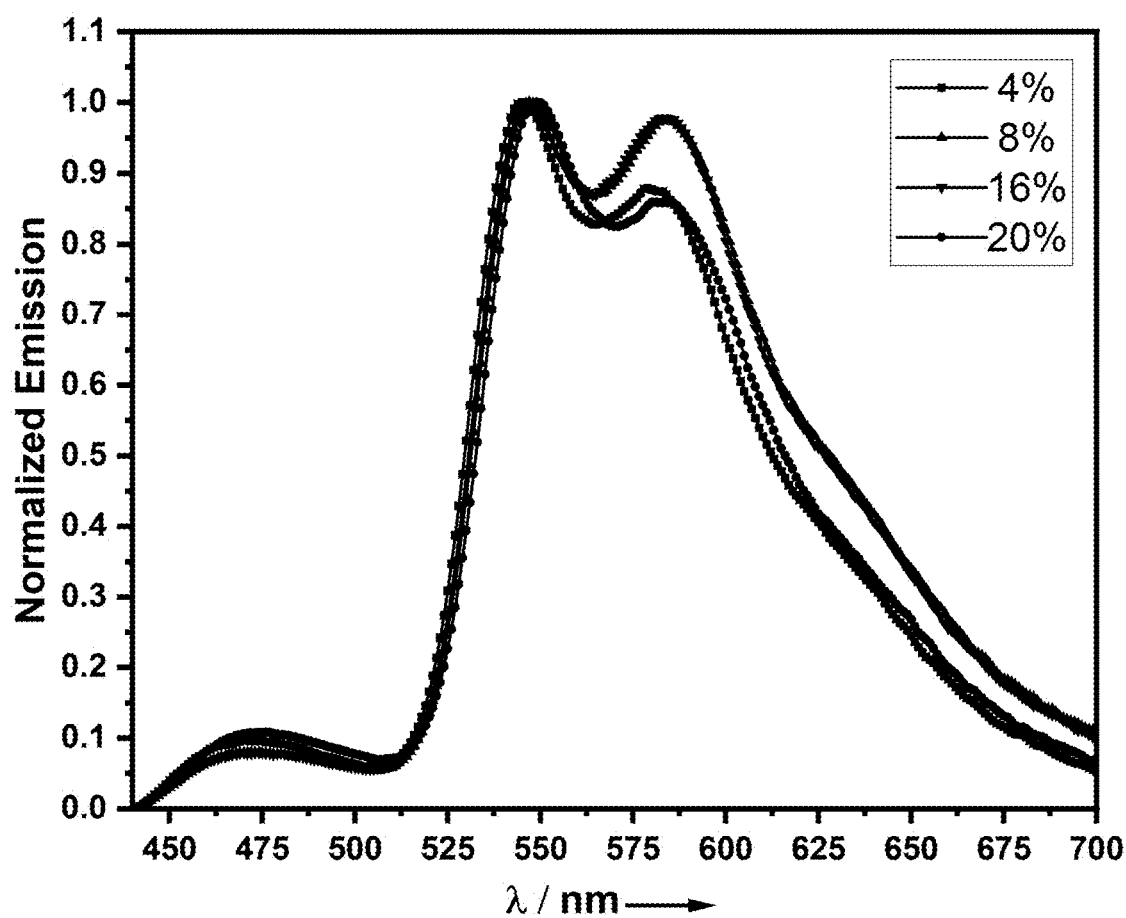
FIG. 13 shows a normalized emission spectrum of the platinum complex $C_3$ of the present disclosure in PYD2 films with different doping concentrations such as 4 wt %, 8 wt %, 16 wt % and 20 wt % at 25° C.
Figure 14:
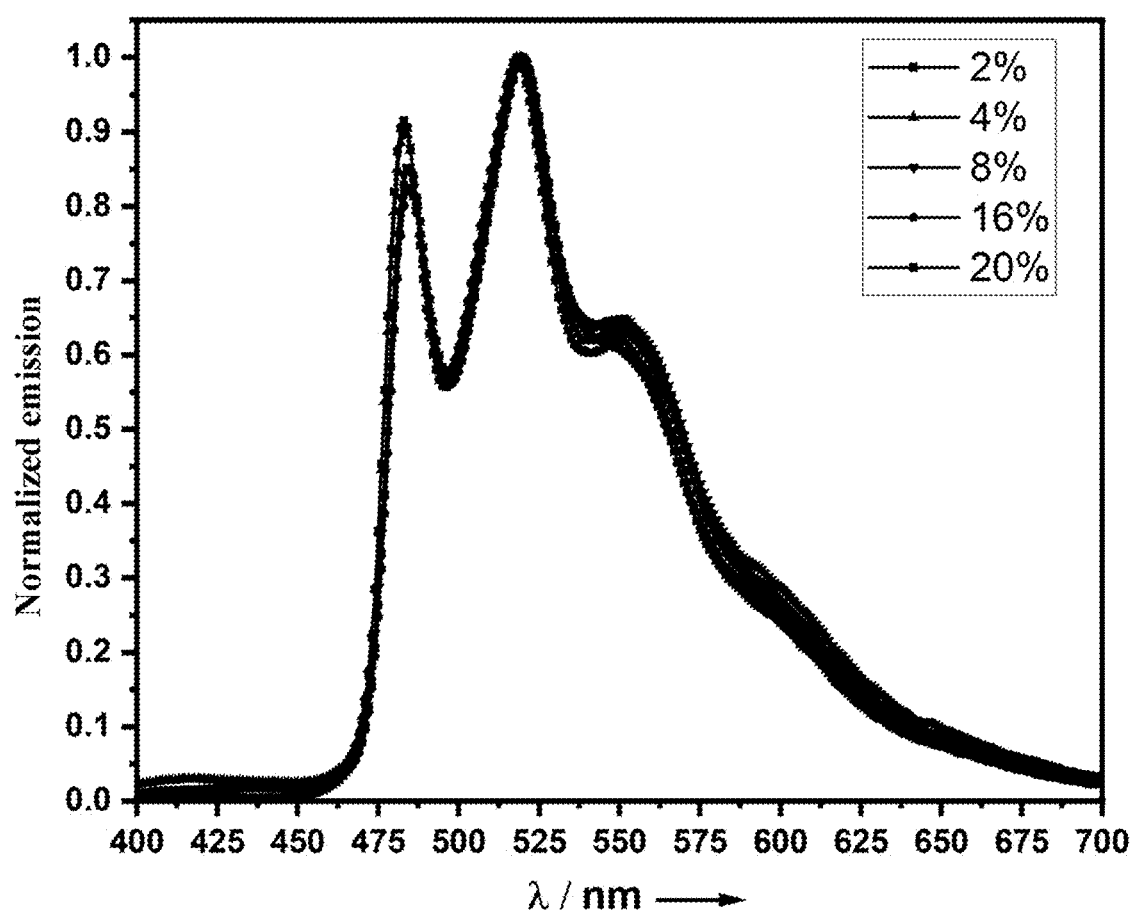
FIG. 14 shows a normalized emission spectrum of the platinum complex $C_2$ of the present disclosure in PMMA films with different doping concentrations such as 2 wt %, 4 wt %, 8 wt %, 16 wt % and 20 wt % at 25° C.
Figure 15A:
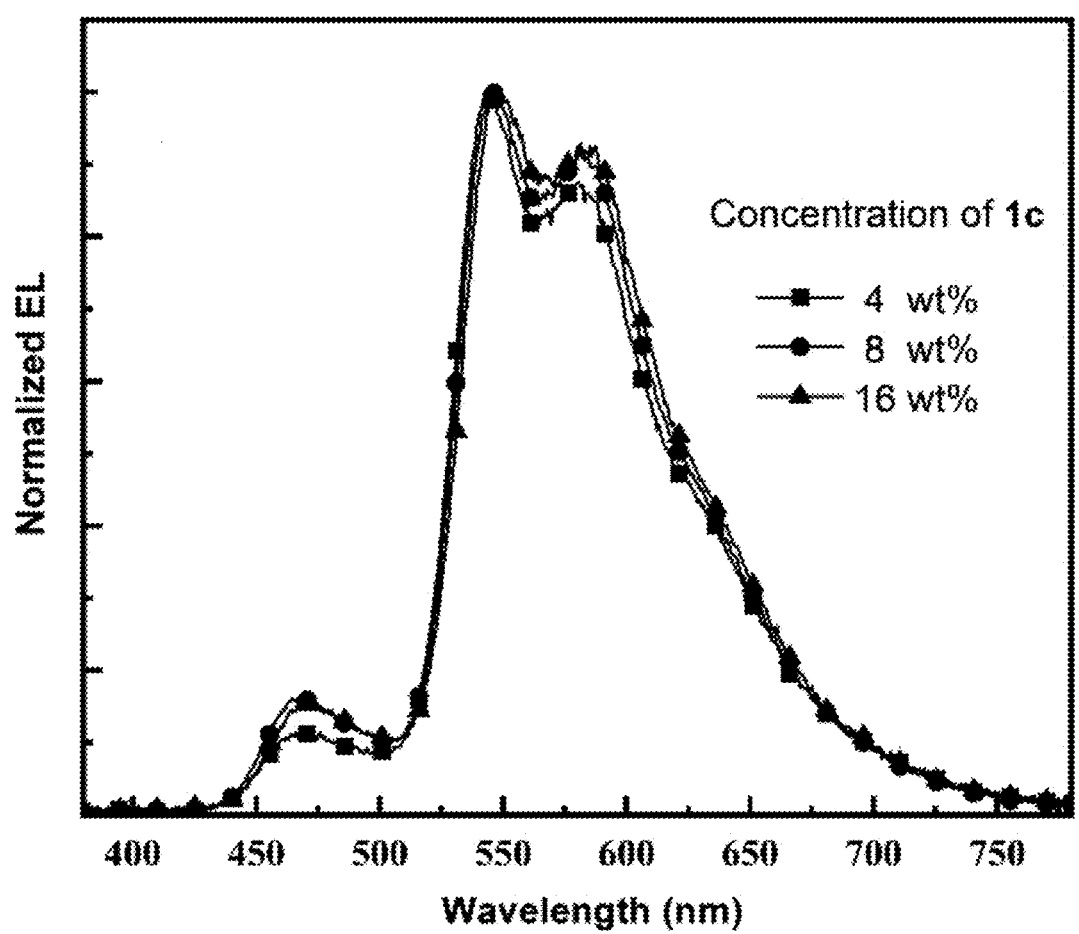
Figure 15B:
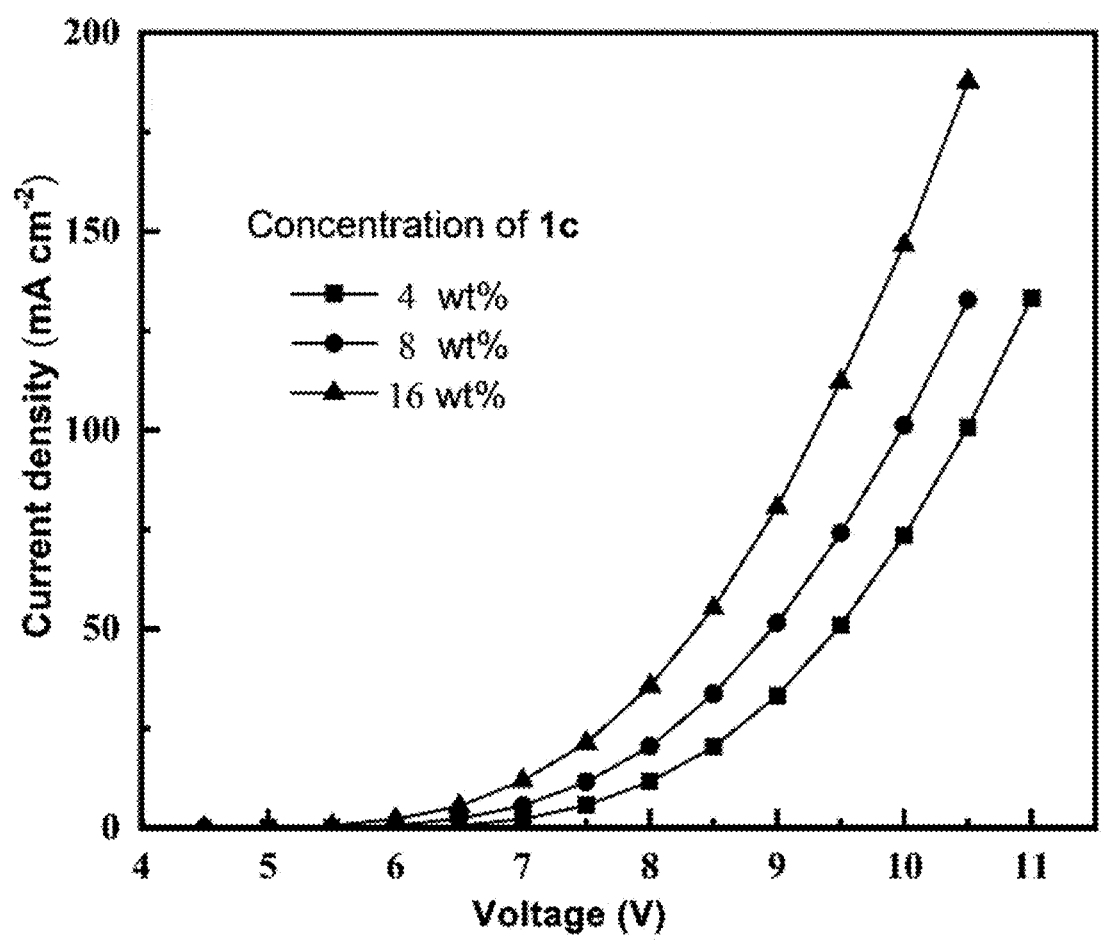
Figure 15C:
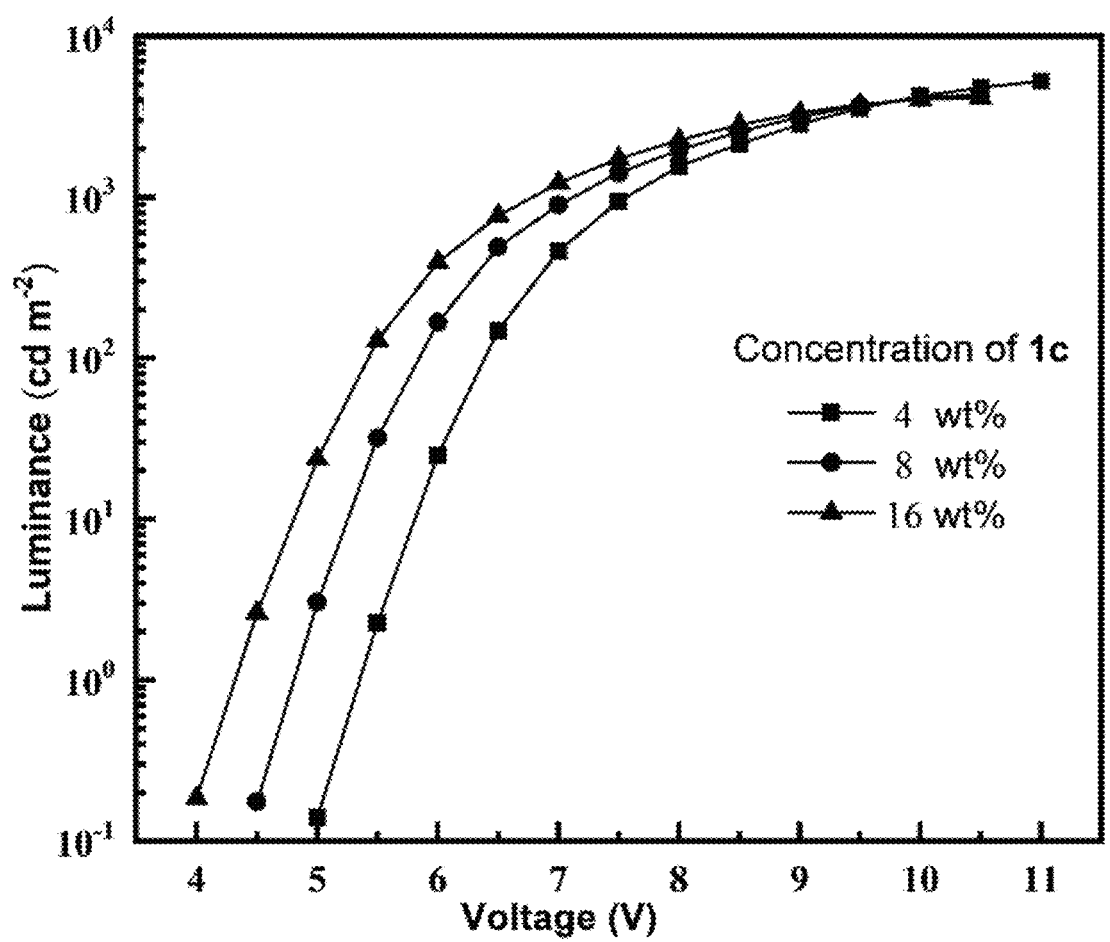
Figure 15D:
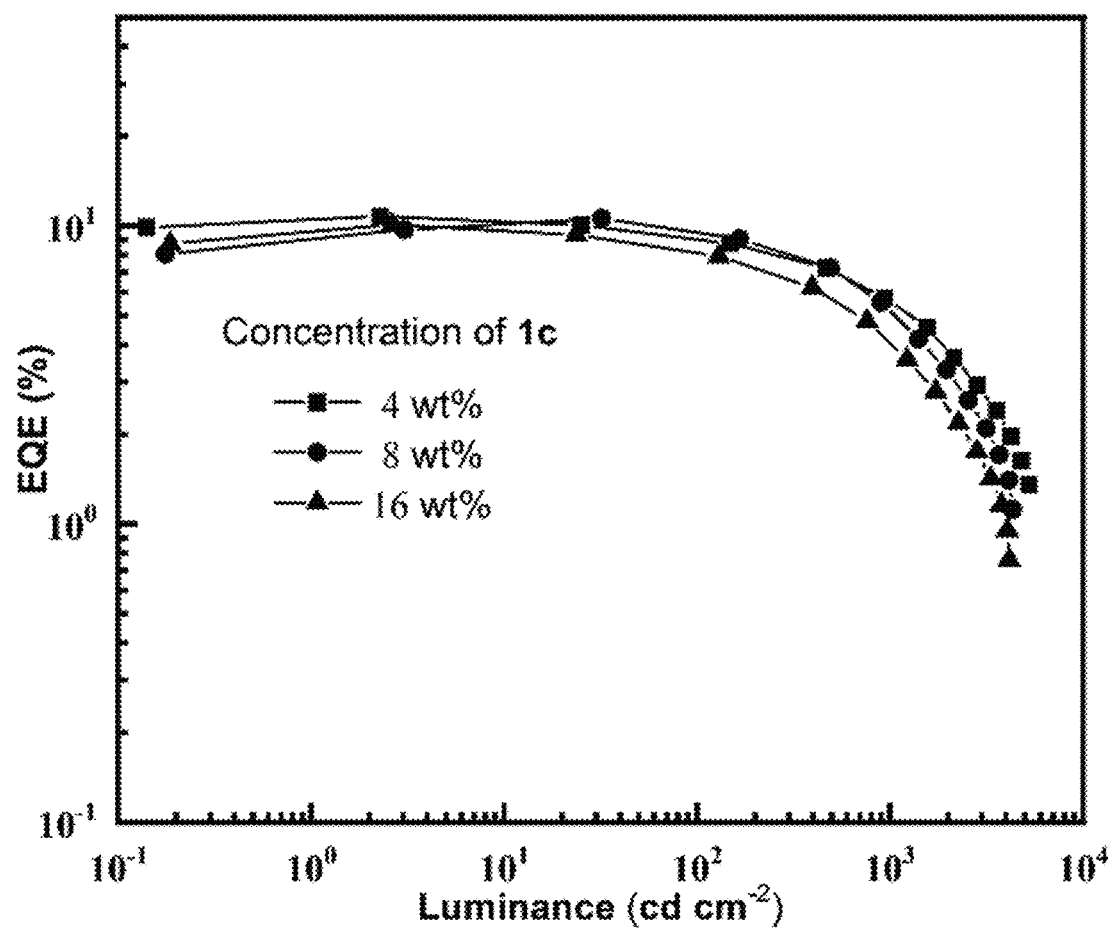

A compound 9,9-(2,6-pyridinediyl)bis-9H-carbazole (PYD2) was used as the host, and the platinum complex $C_2$ was doped with mass fractions of 4%, 8%, 12%, 16% and 20%. Compounds 1,3,5-tris(N-phenylbenzimidazol-2-yl)-benzene (TPBi) and LiF were used as electron transport and electron injection materials, respectively. The EL characteristics of OLEDs were shown in FIG. 6, and key EL data were summarized in Table 2.

As shown in Table 2 and FIG. 7, at a specific driving voltage, the current density of the $C_2$-based device decreased with doping concentration, indicating that direct trapping might be the dominant emission mechanism. The lower LUMO (−2.50 eV) of $C_2$ was deeper than that of the host PYD2 (−2.2 eV), leading to electron trapping in $C_2$-based OLEDs. A maximum external quantum efficiency (EQE) of 18.51% was achieved at a relatively high doping concentration of 20 wt %, which was attributed to a high quantum yield of $C_2$ as high as 0.97 in the film state. In the present disclosure, the organic electroluminescent material can be used as the host material of the emitting layer, and can be applied to the manufacture of OLED emitting devices. Moreover, it can be seen that, in terms of the efficiency and lifespan, the materials of the present disclosure are improved to different degrees compared with the known OLED materials.

TABLE 2

Key properties of electroluminescent devices

| $C_2$ | L [cd m$^{-2}$] | CE [cd A$^{-1}$] Max | CE at 1000 cd m$^2$ | PE [lm W$^1$] Max | PE at 1000 cd m$^{-2}$ | EQE [%] Max | EQE at 1000 cd m$^2$ | CIE [(x, y)] |
|---|---|---|---|---|---|---|---|---|
| 4 wt % | 2500 | 32.26 | 5.60 | 22.53 | 2.84 | 10.83 | 1.88 | 0.29, 0.54 |
| 8 wt % | 3500 | 37.04 | 9.50 | 27.71 | 4.97 | 12.40 | 3.18 | 0.28, 0.55 |
| 16 wt % | 3900 | 46.15 | 12.25 | 29.00 | 6.20 | 15.30 | 4.06 | 0.28, 0.55 |
| 20 wt % | 3770 | 55.88 | 10.99 | 34.38 | 5.31 | 18.51 | 3.64 | 0.28, 0.55 |

Device Example 2

In Device Example 2, an organic electroluminescent device was provided and prepared by the following steps:

The device adopted a traditional indium tin oxide (ITO) device structure, and the device structure was as follows: ITO/PEDOT:PSS/YJ001:PYD-2Cz/DPEPO(10 nm)/TPBi (40 nm)/LiF(1 nm)/Al(100 nm).

A compound 9,9-(2,6-pyridinediyl)bis-9H-carbazole (PYD2) was used as the host, and the platinum complex $C_2$ was doped with mass fractions of 4%, 8% and 16%. Compounds 1,3,5-tris(N-phenylbenzimidazol-2-yl)-benzene (TPBi) and LiF were used as electron transport and electron injection materials, respectively. The EL characteristics of OLEDs were shown in FIG. 15, and key EL data were summarized in Table 3.

As shown in Table 3 and FIG. 15, no apparent host emission was observed in all concentrations of the device, suggesting efficient energy transfer from the host to $C_3$. Due to the relatively low photo-induced quantum yield of 73% in the film state, a maximum external quantum efficiency (EQE) of 10.77% was achieved in a $C_3$-based device with a doping concentration of 4 wt %. Nonetheless, the efficiency roll-off of the $C_3$-based device at a high brightness of 1000 cd m$^{-2}$ was better than that of the $C_1$-based device, being 80% and 47%, respectively, which was attributed to the shorter emission lifetime of the compound. In the present disclosure, the organic electroluminescent material can be used as the host material of the emitting layer, and can be applied to the manufacture of OLED emitting devices. Moreover, it can be seen that, in terms of the efficiency and lifespan, the materials of the present disclosure are improved to different degrees compared with the known OLED materials.

TABLE 3

| | Key properties of electroluminescent devices | | | | | | |
|---|---|---|---|---|---|---|---|
| | | CE [cd A$^{-1}$] | | PE [lm W$^{-1}$] | | EQE [%] | |
| C$_3$ | L [cd m$^{-2}$] | Max | at 1000 cd m$^{-2}$ | Max | at 1000 cd m$^2$ | Max | at 1000 cd m$^{-2}$ | CIE [(x, y)] |
| 4 wt % | 5260 | 31.42 | 5.45 | 18.14 | 2.29 | 10.77 | 1.87 | 0.44, 0.50 |
| 8 wt % | 4320 | 30.90 | 5.35 | 17.82 | 2.25 | 10.60 | 1.84 | 0.44, 0.50 |
| 16 wt % | 4140 | 29.39 | 5.10 | 20.52 | 2.59 | 10.11 | 1.75 | 0.45, 0.49 |

The luminescence properties of the platinum complex C$_2$ and the platinum complex C$_3$ prepared by the present disclosure were summarized under different doping concentrations of the polymethyl methacrylate (PMMA) films and the 2,6-bis(9-carbazolyl)pyridine (PYD2) films. The specific data were shown in Table 4.

TABLE 4

| Complex | Absorption Medium | (T/K) | Emission Wavelength/nm | Quantum yield Φ (%)[a] | τ (μs) | k$_r$ [10$^4$ s$^{-1}$] | k$_{nr}$ [10$^5$ s$^{-1}$] |
|---|---|---|---|---|---|---|---|
| C$_2$ | PMMA[b] | 2% | 483, 518, 547 sh | 0.97 | 10.87 | 8.9 | 0.03 |
| | | 4% | 483, 519, 549 sh | 0.91 | 9.81 | 9.3 | 0.09 |
| | | 8% | 484, 519, 551 sh | 0.88 | 10.54 | 8.3 | 0.11 |
| | | 16% | 485, 520, 549 sh | 0.96 | 9.61 | 10.0 | 0.04 |
| | | 20% | 485, 520, 548 sh | 0.98 | 10.93 | 9.0 | 0.02 |
| | PYD2 | 4% | 485, 520, 547 sh | 0.45 | 3.59 | 12.5 | 1.5 |
| | | 8% | 485, 521, 549 sh | 0.59 | 1.05 | 56.2 | 3.9 |
| | | 16% | 486, 521, 546 sh | 0.64 | 0.72 | 88.9 | 5.0 |
| | | 20% | 486, 521, 546 sh | 0.71 | 0.77 | 92.2 | 3.8 |
| C$_3$ | PMMA[b] | 2% | 466, 542, 577 | 0.73 | 1.50 | 48.7 | 1.8 |
| | | 4% | 470, 545, 580 | 0.46 | 3.63 | 12.7 | 1.5 |
| | | 8% | 471, 546, 580 | 0.37 | 2.74 | 13.5 | 2.3 |
| | | 16% | 472, 546, 580 | 0.31 | 2.41 | 12.9 | 2.9 |
| | | 20% | 475, 550, 581 | 0.25 | 1.58 | 15.8 | 4.7 |
| | PYD2[b] | 4% | 471, 545, 579 | 0.56 | 3.48 | 16.1 | 1.3 |
| | | 8% | 473, 547, 584 | 0.46 | 2.72 | 17.0 | 2.0 |
| | | 16% | 470, 547, 583 | 0.44 | 2.43 | 18.0 | 2.3 |
| | | 20% | 475, 549, 584 | 0.39 | 3.18 | 12.3 | 1.9 |

[a] The phosphorescence quantum yield was measured using an integrating sphere. [b] The measurement was conducted by PMMA films and PYD2 films at different wt % doping concentrations on a quartz plate. The aradiative rate constant (kr) and the non-radiative rate constant (knr) were estimated by using the following equations. kr=φ/τ and knr=(1-φ/τ).

Notes: in the table, "Em" represented "emission wavelength"; "Φ" represented "phosphorescence quantum yield"; "τ" represented "phosphorescence lifetime"; "PMMA" represented "PMMA film state"; "PYD2" represented "PYD2 film state".

Electrochemical Test Example

In this example, the electrochemical properties of the complexes were determined by cyclic voltammetry (CV) using tetra-n-butylammoniumhexafluorophosphate (0.1 mol) as the supporting electrolyte in an anhydrous acetonitrile solution. The platinum complex C$_1$ and the platinum complex C$_2$ prepared by the present disclosure show an irreversible oxidation peak at +1.119 V and +1.094 V (relative to the standard ferrocene), respectively. The platinum complex C$_3$ and the platinum complex C$_4$ showed a reversible oxidation peak at +0.797/+0.701 V and +0.599/+0.516 V (relative to the standard ferrocene), respectively. The irreversible oxidation peaks of the platinum complex C$_1$ and the platinum complex C$_2$ were attributed to the oxidation of phenylpyridine ligands. The reversible oxidation of the platinum complex C$_3$ was assigned to the diphenylamine moiety. The reversible oxidation peak in the platinum complex C$_4$ was assigned to the tert-butylcarbazole group. The oxidation potential of the platinum complex C$_3$ was 0.198 V lower than that of the platinum complex C$_4$, indicating that diphenylamine had a stronger electron donating ability than the carbazole. The obtained electrochemical test results were shown in Table 5.

TABLE 5

| Complex[a] | E$_{ox}$ (V) | E$_{HOMO}$[b] (eV) | E$_{LUMO}$[c] (eV) | E$_g$[d] (eV) |
|---|---|---|---|---|
| 1a | +1.094 | −5.853 | −2.54 | +3.31 |
| 1b | +0.797/+0.701 | −5.483 | −2.26 | +3.22 |
| 1c | +0.599/+0.516 | −5.272 | −2.32 | +2.95 |
| 2a | +1.119 | −5.889 | −2.67 | +3.22 | a represented the measurement in a dry acetonitrile solution. b was HOMO levels calculated from CV data using ferrocene as an internal standard. c was LUMO energy levels calculated from electrochemical data and UV-Vis absorption spectra. d was determined by Eg=hc/λonset.

Note: in the table, "Eox" represented "oxidation peak"; "EHOMO" represented "highest occupied orbital energy"; "ELUMO" represented "lowest unoccupied molecular orbital energy"; "Eg" represented "band gap energy".

What is claimed is:

1. A monocarborane cluster-containing platinum complex, having a general structural formula selected from the group consisting of the following general structural formulas:

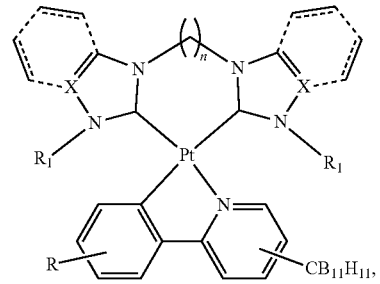

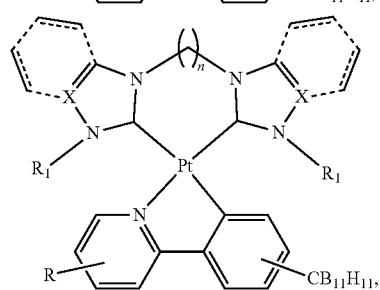

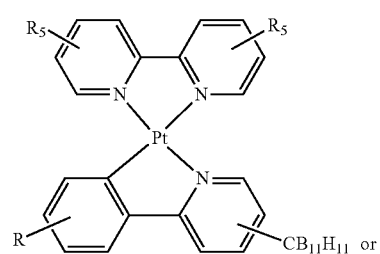

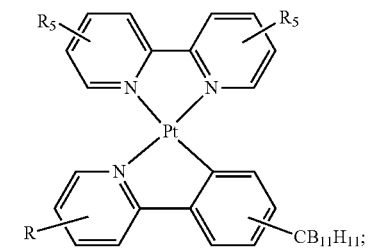

wherein —$R_1$ is selected from the group consisting of $C_{4-12}$ linear alkyl; each R and $R_5$ are independently any one selected from the group consisting of —$CH_3$, H, tert-butyl and aryl; n is 1 to 3; X is an element of C or N; when the ligand of the general structural formula is benzimidazole or imidazole, X is C element; when the ligand of the general structural formula is triazole, X is N element; —$CB_{11}H_{11}$ is monocarborane with a structure of

2. The monocarborane cluster-containing platinum complexes according to claim 1, wherein aryl is any one selected from the group consisting of phenyl, carbazole

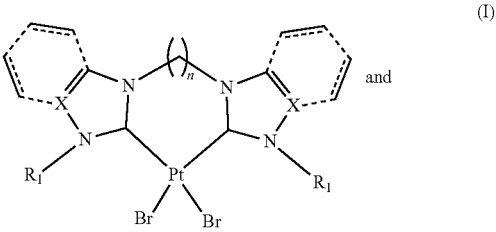

and aniline

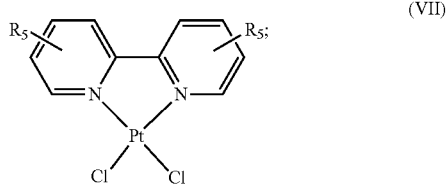

wherein $R_2$ is any one selected from the group consisting of methyl, tert-butyl and phenyl; $R_3$ is any one selected from the group consisting of methyl, tert-butyl and phenyl.

3. A method for preparing the monocarborane cluster-containing platinum complex of claim 1, the method comprising:

step 1, adding a organometallic compound I or a complex VII to a first solvent, and heating to 60° C., and then conducting a reaction with silver trifluoromethanesulfonate in the dark for 1 h; the compound I and the complex VII have the following structural formulas:

step 2, adding a compound III or a compound IV and an alkali to the reaction product obtained from step 1, and conducting a reaction under N$_2$ protection to obtain a reaction mixture; the reaction is conducted at 60° C.; the reaction is conducted for 12 h; the compound III and the compound IV have the following structural formulas:

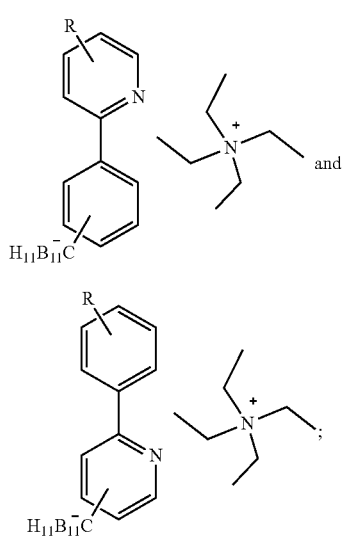

and step 3, cooling the reaction mixture to room temperature, filtering, rotary evaporating to remove the first solvent and purifying through column chromatography isolation to obtain the monocarborane cluster-containing platinum complex.

4. The method according to claim 3, wherein the first solvent is a mixture of dichloromethane and tetrahydrofuran at a ratio of 3:1.

5. The method according to claim 3, wherein a molar ratio of the compound I or the complex VII to the compound III or the compound IV is in a range of 1:(1.1-1.2); a ratio of the compound I to the first solvent is in a range of 1 mmol:(80-150) mL.

6. The method according to claim 3, wherein the alkali is potassium tert-butoxide.

7. The method according to claim 3, wherein the compound I and the complex VII are performed by the following steps:

step 10, adding a compound II and a platinum compound into a second solvent, and heating for a reaction under N$_2$ protection for 10 h to obtain a mixture I; the platinum compound is platinum acetylacetonate; the second solvent is dimethyl sulfoxide; the reaction is performed at 110° C.;

step 11, subjecting the mixture I to a reduced pressure distillation, extracting with dichloromethane, washing with water to obtain an organic phase, collecting the organic phase, drying with anhydrous magnesium sulfate, evaporating the second solvent, purifying through column chromatography isolation and drying to obtain the compound I;

step 12, adding a compound VIII and a platinum compound into a second solvent, and heating for a reaction under N$_2$ protection for 10 h to obtain a mixture II; the platinum compound is potassium tetrachloroplatinate; the second solvent is a mixture of hydrochloric acid and chloroform at a ratio of 4:1; the reaction is performed at 60° C.; and step 13, filtering the mixture II to obtain a filtrate, and washing the filtrate with water, n-hexane, and methanol in sequence to obtain the compound VII;

the compound II and the compound VIII have the following structural formulas:

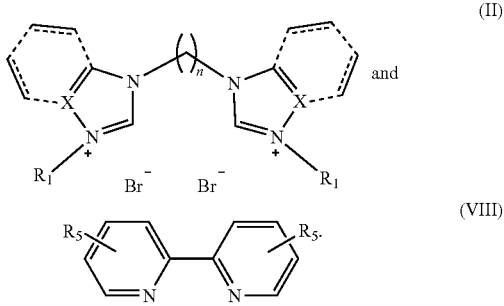

8. The method according to claim 7, wherein a molar ratio of the compound II or the compound VIII to the platinum compound is in a range of 1:(1.1-1.2).

9. The method according to claim 3, wherein the compound III and the compound IV are performed by the following steps:

step 20, putting carborane into a third solvent and adding n-butyl lithium, and then adding cuprous iodide after 1.5 h, and conducting a reaction for 40 min;

step 21, adding a palladium catalyst, a phosphorus ligand, and a compound V or a compound VI into the reaction product obtained from step 20, and conducting a reaction at room temperature for 20-24 h under N$_2$ protection; and step 22, cooling the reaction product obtained from step 21 to room temperature, conducting a suction filtration with diatomaceous earth to obtain a filtrate, extracting the filtrate with ether after rotary evaporation, washing with hydrochloric acid to obtain an organic phase, spin-drying the organic phase, and purifying by cation exchange and column chromatography isolation to obtain the compound III and the compound IV; the compound V and the compound VI have the following structural formulas:

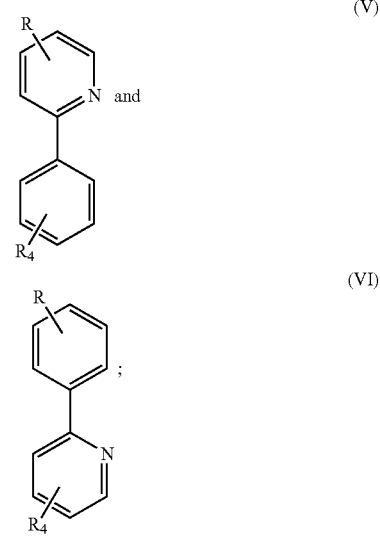

R4 is a halogen group; the third solvent is tetrahydrofuran; the palladium catalyst is palladium acetate; the phosphorus ligand is tris(2-methoxyphenyl)phosphine; a molar ratio of borane to the compound V or the compound VI is 1:1.1; a molar ratio of carborane to the compound V or the compound VI is 1:1.1.

10. A method of using the monocarborane cluster-containing platinum complex of claim 1 in an organic light-emitting diode (OLED), wherein the monocarborane cluster-containing platinum complex is applied to an emission layer of the OLED.

11. The method according to claim 3, wherein aryl is any one selected from the group consisting of phenyl, carbazole

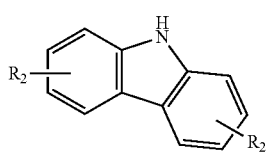

and aniline

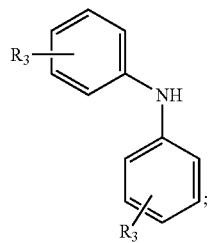

wherein $R_2$ is any one selected from the group consisting of methyl, tert-butyl and phenyl; $R_3$ is any one selected from the group consisting of methyl, tert-butyl and phenyl.

12. The method according to claim 10, wherein aryl is any one selected from the group consisting of phenyl, carbazole

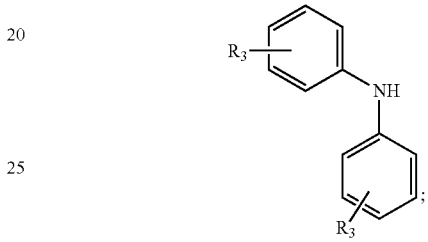

and aniline wherein $R_2$ is any one selected from the group consisting of methyl, tert-butyl and phenyl; $R_3$ is any one selected from the group consisting of methyl, tert-butyl and phenyl.

* * * * *